(12) United States Patent
Matsuda et al.

(10) Patent No.: US 8,932,097 B2
(45) Date of Patent: Jan. 13, 2015

(54) INSULATING PATTERN, METHOD OF FORMING THE INSULATING PATTERN, LIGHT-EMITTING DEVICE, METHOD OF MANUFACTURING THE LIGHT-EMITTING DEVICE, AND LIGHTING DEVICE

(71) Applicant: Semiconductor Energy Laboratory Co., Ltd., Kanagawa-ken (JP)

(72) Inventors: Yutaka Matsuda, Chiba (JP); Takahiro Sato, Tochigi (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 14/103,251

(22) Filed: Dec. 11, 2013

(65) Prior Publication Data
US 2014/0099741 A1  Apr. 10, 2014

Related U.S. Application Data

(62) Division of application No. 13/403,551, filed on Feb. 23, 2012, now Pat. No. 8,610,344.

(30) Foreign Application Priority Data

Feb. 24, 2011 (JP) ................ 2011-038870

(51) Int. Cl.
*H01J 1/62* (2006.01)
*G03F 9/00* (2006.01)
*G03F 7/00* (2006.01)
*H01L 33/36* (2010.01)

(52) U.S. Cl.
CPC ............ *G03F 9/7049* (2013.01); *G03F 7/0035* (2013.01); *H01L 33/36* (2013.01)
USPC .............................. 445/23; 445/24

(58) Field of Classification Search
CPC .............................. H01L 33/36; G03F 9/7049
USPC ...................................................... 445/23–25
See application file for complete search history.

(56) References Cited

U.S. PATENT DOCUMENTS

| | | | |
|---|---|---|---|
| 6,373,187 | B1 | 4/2002 | Nagayama et al. |
| 7,161,184 | B2 | 1/2007 | Miyagi et al. |
| 7,178,927 | B2 | 2/2007 | Seo |
| 7,301,276 | B2 | 11/2007 | Yamazaki et al. |
| 7,834,543 | B2 | 11/2010 | Takata |

(Continued)

FOREIGN PATENT DOCUMENTS

| | | |
|---|---|---|
| JP | 9-211868 | 8/1997 |
| JP | 2005-235491 | 9/2005 |

(Continued)

*Primary Examiner* — Elmito Breval
(74) *Attorney, Agent, or Firm* — Husch Blackwell LLP

(57) ABSTRACT

A simple formation method of an insulating pattern having an eaves portion using one light-exposure mask is provided. As the formation method of an insulating pattern having an eaves portion, first, a first photosensitive organic layer is formed over a substrate, and then a first region is exposed to light with the use of a light-exposure mask, so that a leg portion is formed. After that, a second photosensitive organic layer is formed, the light-exposure mask is moved in the direction parallel to the substrate, and then a second region partly overlapping with the first region is exposed to light plural times, so that a stage portion is formed. The insulating pattern formed by this method may be applied to the light-emitting device or the lighting device.

6 Claims, 14 Drawing Sheets

(56) References Cited

U.S. PATENT DOCUMENTS

| | | |
|---|---|---|
| 7,888,864 B2 | 2/2011 | Young |
| 7,943,938 B2 | 5/2011 | Miyagi et al. |
| 7,999,463 B2 | 8/2011 | Nomura |
| 2003/0060055 A1 | 3/2003 | Kamijima |
| 2011/0089814 A1 | 4/2011 | Nomura |
| 2011/0089823 A1 | 4/2011 | Nomura |
| 2011/0101388 A1 | 5/2011 | Nomura |
| 2011/0140617 A1 | 6/2011 | Nomura |
| 2011/0210335 A1 | 9/2011 | Miyagi et al. |

FOREIGN PATENT DOCUMENTS

| | | |
|---|---|---|
| JP | 2009-130132 | 6/2009 |
| WO | WO 2004/044987 A2 | 5/2004 |

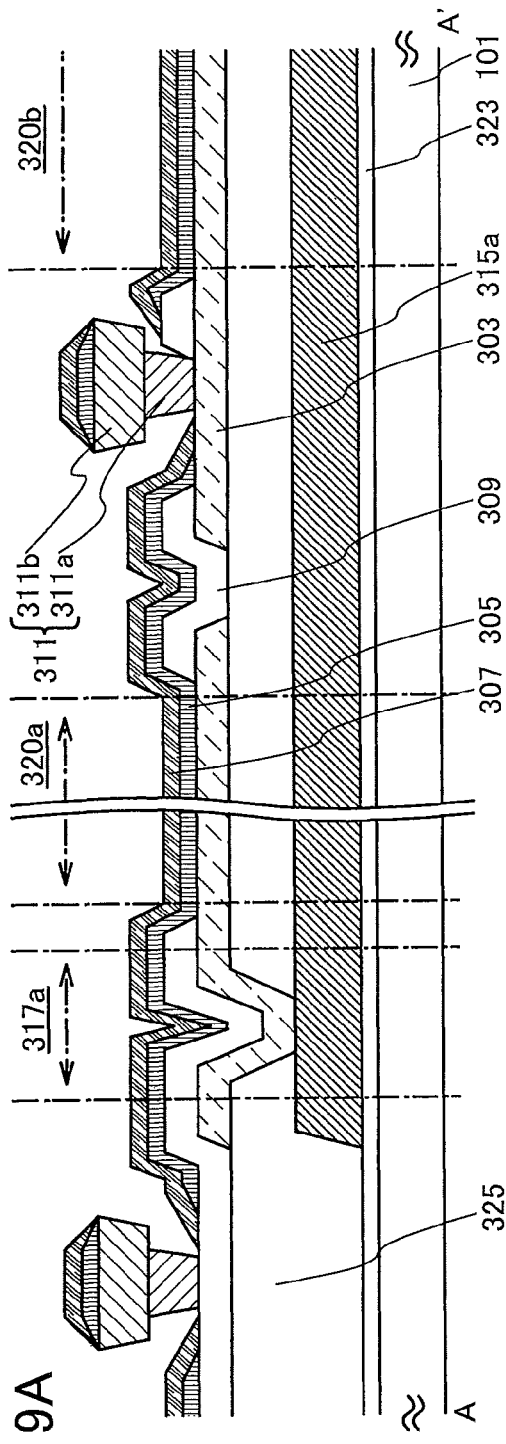
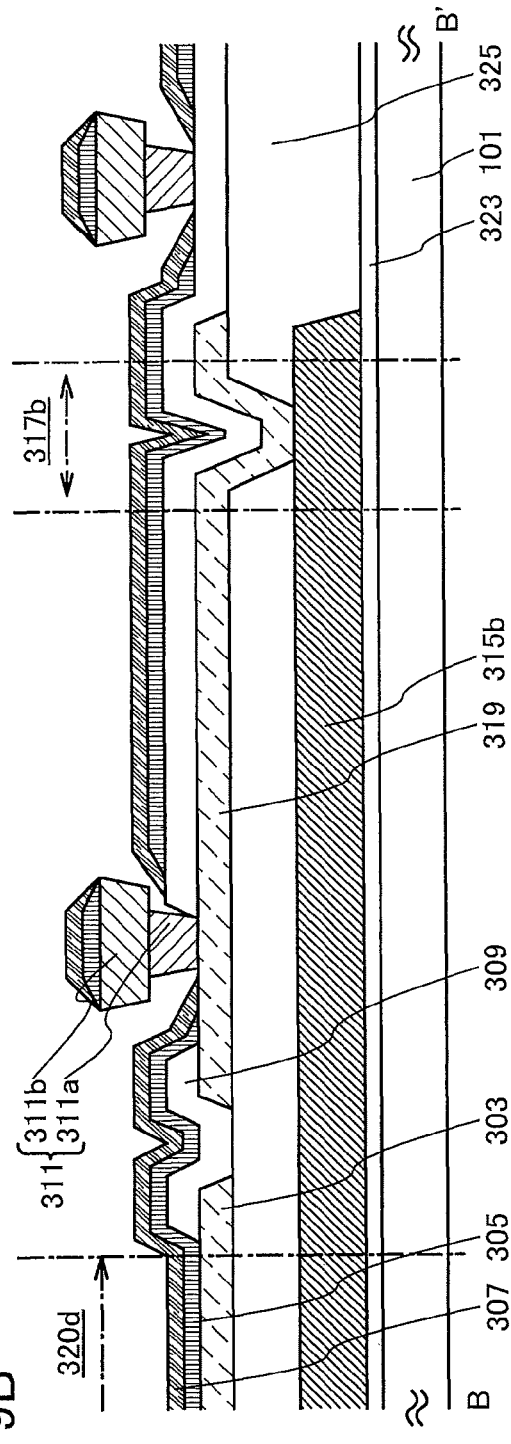
FIG. 9A
FIG. 9B

INSULATING PATTERN, METHOD OF FORMING THE INSULATING PATTERN, LIGHT-EMITTING DEVICE, METHOD OF MANUFACTURING THE LIGHT-EMITTING DEVICE, AND LIGHTING DEVICE

This application is a divisional of copending application Ser. No. 13/403,551 filed on Feb. 23, 2012.

BACKGROUND OF THE INVENTION

1. Field of the Invention

One embodiment of the present invention relates to an insulating pattern and a method of forming the insulating pattern. One embodiment of the present invention relates to a light-emitting device using electroluminescence (EL) and a method of manufacturing the light-emitting device. One embodiment of the present invention relates to a lighting device.

2. Description of the Related Art

A method of forming a thin film pattern is known in which an inverted tapered or T-shaped insulating pattern which has an eaves portion is formed to be used as a separation layer for dividing a film (hereinafter, referred to as "separation layer"). Specifically, a separation layer having an eaves portion is formed and a thin film is formed thereover, whereby a thin film pattern can be formed in which the thin film is not formed in a region covered by a projecting part of the separation layer and the thin film is physically divided.

A method (lift-off method) is well known in which by applying the above technique, a conductive thin film is used as a thin film formed over a separation layer and the separation layer is removed after the thin film is formed, whereby only a conductive thin film pattern remains.

As a method of forming an inverted tapered separation layer, a method in which a negative photosensitive resin is used, light exposure is performed, and development is performed is known.

As a method of forming a T-shaped separation layer, a method (manufacturing method 1) is known in which the amount of light to which a negative photosensitive resin is exposed is smaller and the time of development treatment is shorter than in a usual method, whereby a T-shaped separation layer is formed (Patent Document 1).

As another formation method, a method (manufacturing method 2) is known in which resins with different photosensitivities are stacked, light exposure is performed separately for each of the upper resin and the lower resin with the use of different light-exposure masks, and then development treatment is performed, whereby a T-shaped separation layer is formed.

Further, an organic EL element has been actively researched and developed. In the fundamental structure of the organic EL element, a layer containing a light-emitting organic compound is interposed between a pair of electrodes. By applying voltage to this element, light can be emitted from the light-emitting organic compound.

The organic EL element can be formed into a film form; thus, a large-area element can be easily formed. Therefore, the organic EL element has a high utility value as a surface light source that can be applied to lighting or the like.

For example, a lighting device including an organic EL element is disclosed in Patent Document 2.

REFERENCE

[Patent Document 1] Japanese Published Patent Application No. H9-211868
[Patent Document 2] Japanese Published Patent Application No. 2009-130132

The above-described inverted tapered or T-shaped insulating pattern which has an eaves portion (also referred to as "separation layer") is left without being removed after a thin film is formed in some cases.

For example, in the case of using the separation layer in a manufacturing method of a light-emitting device using an organic EL element, an EL film and a conductive film are formed over a substrate over which a lower electrode layer and a separation layer are formed to form a pattern in which an EL layer and a conductive layer each divided by the separation layer are stacked; if the separation layer is removed after the stacked-layer pattern is formed, a problem that the EL layer which is an organic film is dissolved is caused. In view of the above problem, it is preferable that the separation layer be left without being removed.

However, depending on the shape of the separation layer having an eaves portion, such as an inverted tapered shape or a T shape, when the coverage with an EL film or a conductive film is high, a thin film is formed on a sidewall of the separation layer and the thin film cannot be surely divided in some cases.

Therefore, it is preferable that a leg portion and a stage portion having an eaves portion which greatly projects beyond the leg portion in the direction parallel to the substrate be included in the separation layer so that a thin film can be divided without fail even in the case where the coverage with the thin film in forming the thin film is high. In particular, a manufacturing method in which the length of the eaves portion of the stage portion, which projects beyond the leg portion, can be controlled is needed. However, a conventional manufacturing method of a T-shaped separation layer has problems described below.

In the manufacturing method 1, a stable shape cannot be obtained on a substrate surface because the amount of light for light exposure and the development time are different from those in a usual method. In addition, there is a problem that the length of a projecting region of a stage portion of a T-shaped separation layer cannot be set to arbitrary length.

In the manufacturing method 2, a stage portion of a T-shaped separation layer can be formed in an arbitrary shape; however, two kinds of resins each having a photosensitivity and light-exposure masks for forming two patterns are needed, which causes a problem of an increase in manufacturing cost.

SUMMARY OF THE INVENTION

The present invention is made in view of the foregoing technical background. Therefore, an object of one embodiment of present invention is to provide a method of easily forming an insulating pattern having an eaves portion with the use of one light-exposure mask. An object of one embodiment of the present invention is to provide an insulating pattern having an eaves portion, with which a thin film formed thereover can be divided without fail, and a method of forming the insulating pattern. An object of one embodiment of the present invention is to provide a light-emitting device in which the insulating pattern is used, a method of manufacturing the light-emitting device, and a lighting device.

In order to achieve the above objects, the present invention focuses on a light-exposure method in forming a separation layer having an eaves portion. First, a first organic layer having a photosensitivity is formed over a substrate, a first region is exposed to light with the use of a light-exposure mask, and then development treatment is performed, so that a leg portion is formed. After that, a second organic layer having a photosensitivity is formed, the light-exposure mask used for the light exposure performed on the first region is moved in the direction parallel to the substrate, a second region partly overlapping with the first region is exposed to light plural times, and then development treatment is performed, so that a stage portion is formed. Further, such a formation method may be applied to a light-emitting device.

An insulating pattern (also referred to as "separation layer") formed by the above formation method may have a shape which allows a thin film formed over the insulating pattern to be divided without fail. Further, such an insulating pattern may be used in a light-emitting device or a lighting device, as a separation layer for dividing an EL film or a conductive film included in an EL element.

In other words, a method of forming an insulating pattern according to one embodiment of the present invention includes the steps of: forming a first organic film having a negative photosensitivity over a substrate; selectively exposing a first region of the first organic film to light through a light-exposure mask; removing an unexposed portion of the first organic film to form a leg portion; forming a second organic film having a negative photosensitivity so as to cover the leg portion; selectively exposing a second region of the second organic film, which partly overlaps with the leg portion, to light through the light-exposure mask; and removing part of the second organic film, which is not exposed to light, to form a stage portion over the leg portion, which has an eaves portion projecting beyond the leg portion in the direction parallel to the substrate.

According to the above formation method, an insulating pattern having an eaves portion (also referred to as "separation layer") can be easily formed using one light-exposure mask. In addition, by performing light exposure twice for separately forming a leg portion and a stage portion of the insulating pattern, variation in the shape of the leg portion and the stage portion, which is caused due to instability of light exposure, can be suppressed and the insulating pattern can have a stable shape.

A method of manufacturing a light-emitting device according to one embodiment of the present invention includes the steps of: forming a lower electrode layer over a substrate; forming a first organic film having a negative photosensitivity over the substrate; selectively exposing a first region of the first organic film to light through a light-exposure mask; removing part of the first organic film, which is not exposed to light, to form a leg portion; forming a second organic film having a negative photosensitivity so as to cover the leg portion; selectively exposing a second region of the second organic film, which partly overlaps with the leg portion, to light through the light-exposure mask; removing part of the second organic film, which is not exposed to light, to form an insulating pattern having a stage portion over the leg portion, which has an eaves portion projecting beyond the leg portion in the direction parallel to the substrate; forming an EL layer over the insulating pattern and the lower electrode layer so as to be divided by the insulating pattern; and forming an upper electrode layer covering the EL layer over the insulating pattern and the lower electrode layer so as to be divided by the insulating pattern.

An EL layer and a conductive layer serving as an upper electrode layer are formed in a region including an insulating pattern formed by the above formation method, whereby each of the layers can be divided by the insulating pattern. Thus, a stacked layer of an EL layer and an upper electrode layer is formed over a substrate over which a lower electrode layer and the insulating pattern are formed, whereby a region where each of the layers is divided and a light-emitting element can be formed at the same time. By manufacturing a light-emitting device by such a manufacturing method, an insulating pattern having an eaves portion which allows a film to be divided without fail and a light-emitting element can be easily formed over the same substrate.

According to one embodiment of the present invention, an insulating pattern includes a leg portion and a stage portion over the leg portion, which has an eaves portion projecting beyond the leg portion in the direction parallel to the substrate. The insulating pattern has a depressed portion in a region where a bottom surface of a stage portion, which faces a substrate, is in contact with an upper edge of a side surface of the leg portion. The leg portion and the stage portion have insulating properties.

According to the above method of forming an insulating pattern according to one embodiment of the present invention, an insulating pattern with such a characteristic shape can be formed. An insulating pattern with such a shape allows a thin film formed over the insulating pattern to be divided without fail even in the case where the amount of entry of the thin film into a space between a substrate and a stage portion is large. Specifically, in the insulating pattern, a depressed portion is formed in a region where a bottom surface of a stage portion, which faces a substrate, is in contact with an upper edge of a side surface of a leg portion. Such a depressed region surrounded by the leg portion and the stage portion is effectively shielded from incoming particles (e.g., atoms, molecules, and ions) at the time of film formation even in the case where the amount of entry of a thin film formed over the insulating pattern into the space is large; thus, in the depressed portion, the thin film is not foamed and can be divided.

According to one embodiment of the present invention, an insulating pattern includes a leg portion and a stage portion over the leg portion, which has an eaves portion projecting beyond the leg portion in the direction parallel to the substrate. Part of a bottom surface of the stage portion, which faces the substrate, projects to be in contact with a top surface of the leg portion. The bottom surface of the stage portion and the top surface of the leg portion face each other with a space therebetween. The leg portion and the stage portion have insulating properties.

Part of the stage portion is in contact with the leg portion, and the bottom surface of the stage portion and the top surface of the leg portion face each other with a space therebetween in the insulating pattern as described above, whereby even in the case where the amount of entry of a thin film formed over the insulating pattern into a space between the substrate and the stage portion is large, incoming particles (e.g., atoms, molecules, and ions) are effectively blocked in the space between the bottom surface and the leg portion; thus, the film can be effectively divided.

One embodiment of the present invention is a light-emitting device including, over the substrate, a first light-emitting element, a second light-emitting element, and an insulating pattern provided next to and between the first light-emitting element and the second light-emitting. The first light-emitting element includes a stacked layer of a first lower electrode layer, a first EL layer, and a first upper electrode layer. The second light-emitting element includes a stacked layer of a second lower electrode layer, a second EL layer, and a second upper electrode layer. The insulating pattern includes a leg portion and a stage portion over the leg portion, which has an eaves portion projecting beyond the leg portion in the direction parallel to the substrate. The first lower electrode layer and the second lower electrode layer are formed from the same layer and are separated at the insulating pattern. The first EL layer and the second EL layer are formed from the same layer. The first upper electrode layer and the second upper electrode layer are formed from the same layer and are separated at the insulating pattern.

In the light-emitting device according to one embodiment of the present invention, the insulating pattern has a depressed portion in a region where a bottom surface of a stage portion, which faces a substrate, is in contact with an upper edge of a side surface of a leg portion.

In the light-emitting device according to one embodiment of the present invention, the insulating pattern includes a region where part of a bottom surface of a stage portion, which faces a substrate, projects to be in contact with a top surface of a leg portion and a region where the bottom surface of the stage portion and the top surface of the leg portion face each other with a space therebetween.

One embodiment of the present invention is a lighting device including the light-emitting device.

An insulating pattern according to one embodiment of the present invention is preferably used in a light-emitting device, as a separation layer for dividing an EL film or a conductive film included in an EL element, in which case the insulating pattern and a light-emitting element can be formed over the same substrate through simple steps. Further, when such an insulating pattern is provided between two adjacent light-emitting elements in a light-emitting device including two or more light-emitting elements, a conductive film from which electrodes of the light-emitting elements are formed can be divided without fail in forming the conductive film, whereby the light-emitting elements can be electrically separated from each other. Further, such a light-emitting device can be used in a lighting device.

Note that in this specification, an "EL layer" refers to a layer provided between a pair of electrodes in a light-emitting element. Therefore, a light-emitting layer containing an organic compound that is a light-emitting substance which is interposed between electrodes is one embodiment of the EL layer.

According to one embodiment of the present invention, a method of easily forming an insulating pattern having an eaves portion with the use of one light-exposure mask can be provided. In addition, an insulating pattern having an eaves portion which allows a thin film formed thereover to be divided without fail and a method of forming the insulating pattern can be provided. In addition, a light-emitting device in which the insulating pattern is used, a method of manufacturing the light-emitting device, and a lighting device can be provided.

BRIEF DESCRIPTION OF THE DRAWINGS

FIGS. 9A and 9B illustrate the lighting device according to one embodiment of the present invention.

DETAILED DESCRIPTION OF THE INVENTION

Figure 1A:
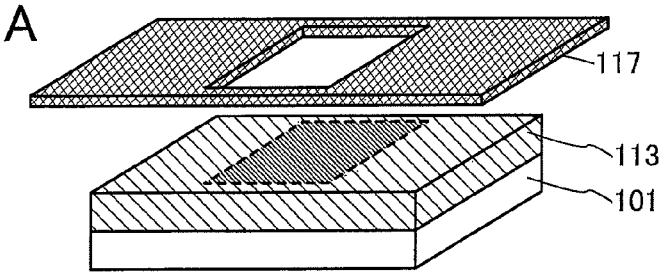
FIGS. 1A to 1E illustrate a method of forming a separation layer according to one embodiment of the present invention.

Embodiments and an example will be described in detail with reference to the accompanying drawings. Note that the present invention is not limited to the following description, and it will be easily understood by those skilled in the art that various changes and modifications can be made without departing from the spirit and scope of the present invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not necessarily limited to such scales.

Embodiment 1

In this embodiment, a formation method of a separation layer having an eaves portion according to one embodiment of the present invention and a separation layer formed by the formation method will be described with reference to FIGS. 1A to 1E, FIGS. 2A to 2E, FIGS. 3A to 3C, and FIGS. 4A to 4C.

<Structural Example>

Figure 1B:
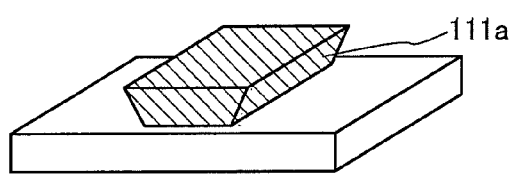
Figure 1C:
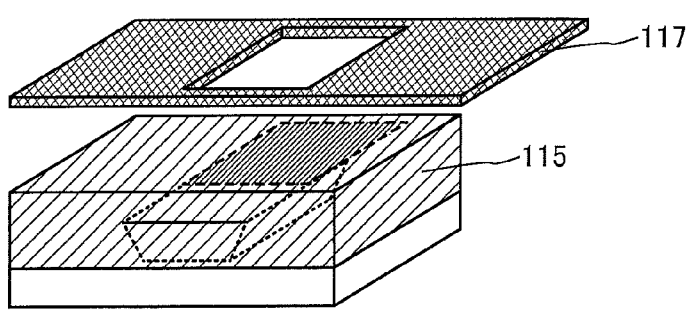
Figure 1D:
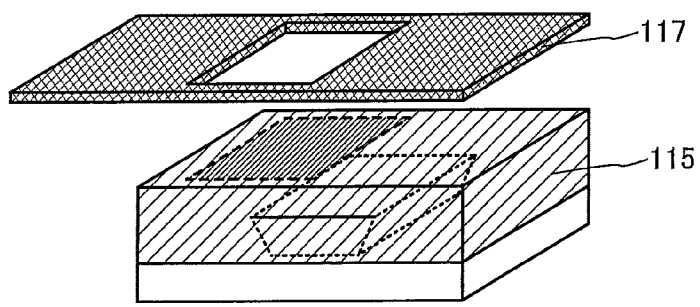
Figure 1E:
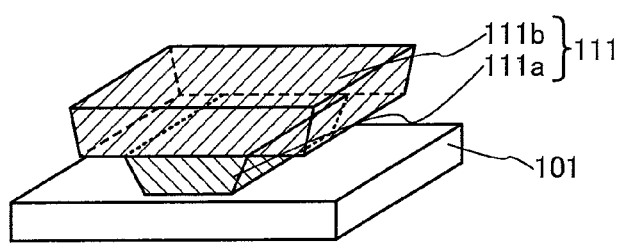

FIG. 1E is a schematic perspective view of a separation layer 111 formed over a substrate 101 by a formation method according to one embodiment of the present invention.

The separation layer 111 includes a leg portion 111a and a stage portion 111b provided on and in contact with the leg portion 111a.

The leg portion 111a has a so-called inverted tapered shape in which the angle formed by a side surface of the leg portion 111a and the substrate is less than 90°.

The stage portion 111b is provided on and in contact with the leg portion 111a. The area of a bottom surface of the stage portion 111b, which faces the substrate, is larger than the area of a surface of the stage portion, which is in contact with the leg portion 111a. At least part of the bottom surface of the stage portion 111b is exposed.

As described above, the separation layer 111 has the leg portion 111a and the stage portion 111b having an eaves portion projecting beyond the leg portion 111a in the direction parallel to the substrate. When a thin film is formed over the substrate 101 over which the separation layer 111 with such a shape is formed, the thin film is not formed in a region covered by the eaves portion. Thus, the thin film can be physically divided in forming the film.

<Example of Manufacturing Process>

Next, a method of forming the separation layer 111 with the use of one light-exposure mask will be described with reference to FIGS. 1A to 1E.

First, a first organic film 113 is formed over the substrate 101. The first organic film 113 can be formed using an organic resin material having a photosensitivity. Here, the first organic film 113 can be formed using an organic resin material having a negative photosensitivity. An organic resin material having a negative photosensitivity is preferably used, in which case the leg portion 111a which is formed later can easily have an inverted tapered shape.

The first organic film 113 can be formed by a coating method such as spin coating, dip coating, or spray coating, a droplet discharge method (e.g., an inkjet method), a screen printing method, an offset printing method, or a formation method using a tool such as a doctor knife, a roll coater, a curtain coater, or a knife coater.

Then, first light exposure for irradiating a region in the first organic film 113, which becomes the leg portion 111a later, with light is performed using a light-exposure mask 117 (FIG. 1A). In this embodiment, an organic resin material having a negative photosensitivity is used for the first organic film 113. Thus, a region exposed to light has low solubility to development treatment performed later, and the region remains as a film after the development treatment.

Development treatment is performed after the first light exposure, so that the leg portion 111a is formed (FIG. 1B). Here, it is preferable that heat treatment for thermally curing the leg portion 111a be performed as part of the development treatment.

Then, a second organic film 115 covering the leg portion 111a is formed. The second organic film 115 is formed so that the thickness of the second organic film 115 over the substrate 101 is larger than the thickness of the leg portion 111a. The second organic film 115 can be formed by a method similar to that of the first organic film 113.

The second organic film 115 is formed of a film having a negative photosensitivity as in the case of the first organic film 113. Note that the first organic film 113 and the second organic film 115 may be formed using the same material or materials with different sensitivities to light. In this embodiment, the same organic resin film having a negative photosensitivity is used as the first organic film 113 and the second organic film 115.

Then, light exposure is performed on the second organic film 115 with the use of the light-exposure mask 117.

First, the light-exposure mask 117 is moved from the region exposed to light in forming the leg portion 111a in one direction parallel to the substrate, and then second light exposure is performed (FIG. 1C). Here, the second light exposure is performed under the condition that a region of the second organic film 115, which is close to the substrate 101, is not exposed to light. When the above light exposure is performed, only an upper portion of the second organic film 115 is not dissolved in later development treatment. As a result, the separation layer 111 in which a region of the stage portion 111b, which does not overlap with the leg portion 111a, projects can be formed.

Then, the light-exposure mask 117 is moved to the side opposite to the side where the second light exposure is performed, and then third light exposure is performed (FIG. 1D). The third light exposure can be performed in a manner similar to that of the second light exposure.

Here, it is preferable that the third light exposure be performed so that a region on which the third light exposure is performed partly overlaps with a region on which the second light exposure is performed. In addition, it is preferable that an overlapping region between the regions overlaps with the region on which the first light exposure is performed (i.e., the region where the leg portion 111a is formed).

The region where the region on which the second light exposure is performed and the region on which the third light exposure is performed overlap with each other is subjected to light exposure twice; thus, the second organic film 115 is exposed to light down to a deep region in the thickness direction. In view of the above, the second light exposure and the third light exposure are performed so that the region where these regions overlap with each other is positioned over the leg portion 111a, whereby part of the stage portion 111b formed later can be prevented from being in contact with the substrate 101.

Development treatment is performed after the second light exposure and the third light exposure are performed, so that an unexposed portion of the second organic film 115 is removed; thus, the stage portion 111b is formed (FIG. 1E). Here, the stage portion 111b may be subjected to heat treatment so as to be thermally cured.

Through the above steps, the separation layer 111 having the eaves portion is formed over the substrate 101.

When the separation layer 111 is formed by such a formation method, the leg portion 111a and the stage portion 111b can be formed using one light-exposure mask 117, which allows a reduction in the manufacturing cost. Moreover, since the stage portion 111b is formed after the leg portion 111a is formed, the leg portion 111a and the stage portion 111b each can be formed in a stable shape and a variation in shape is extremely small. Furthermore, the region of the stage portion 111b, which projects in the direction parallel to the substrate 101, can be set depending on the amount of movement of the light-exposure mask 117 in the direction parallel to the substrate; thus, the separation layer 111 with a desired shape can be formed in accordance with the purpose.

<Modification Example>

In the above description, the method of forming the separation layer 111 having regions of the stage portion 111b, which project in the opposite directions, by performing light exposure twice (the second light exposure and the third light exposure) after the second organic film is formed is described. The projecting regions of the stage portion 111b can be formed along the periphery of the separation layer 111 by performing light exposure on the second organic film plural times.

FIGS. 2A to 2D are schematic top views illustrating regions of the second organic film 115 to be exposed to light. Note that in each of FIGS. 2A to 2D, a portion corresponding to the contour of the leg portion 111a is shown by a dashed line.

Figure 2A:
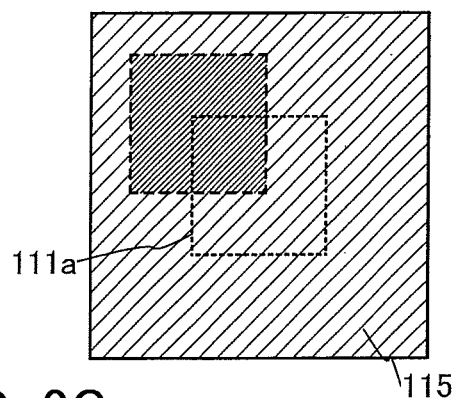
FIGS. 2A to 2E illustrate a method of forming a separation layer according to one embodiment of the present invention.
Figure 2B:
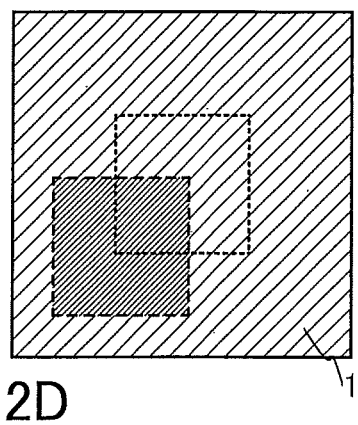
Figure 2C:
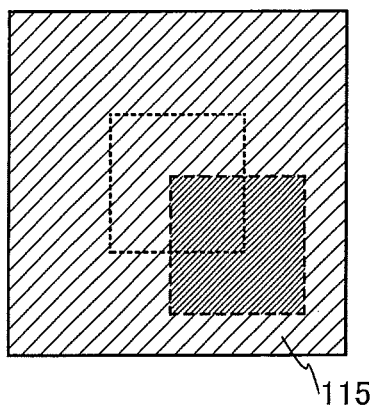
Figure 2D:
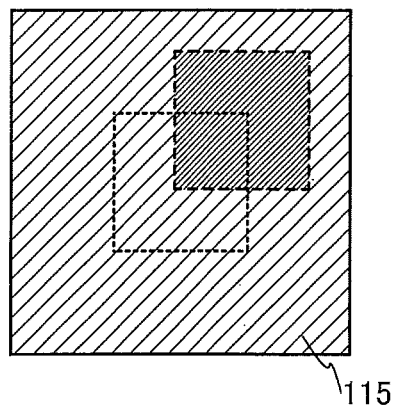
Figure 2E:
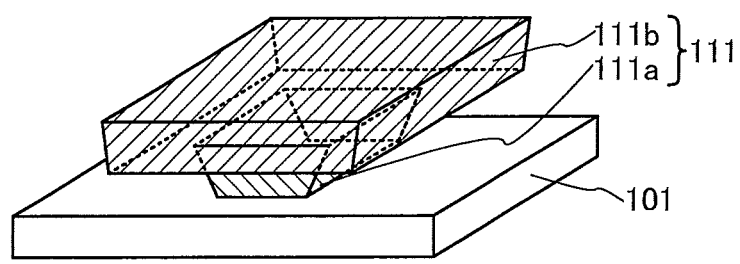

Light exposure is performed on the second organic film 115 four times around the leg portion 111a as illustrated in FIGS. 2A to 2D, whereby the separation layer 111 having a region of the stage portion 111b, which projects along the periphery of the separation layer 111, can be formed as illustrated in FIG. 2E.

<Light Exposure Condition and Shape of Separation Layer>

The shape of the stage portion 111b formed later can be controlled by the conditions of light exposure performed on the second organic film 115, which makes it possible to form the separation layer 111 in a characteristic shape. The conditions of light exposure performed on the second organic film 115 and the shape of the formed separation layer 111 will be described below with reference to FIGS. 3A to 3C and FIGS. 4A to 4C. FIGS. 3A to 3C and FIGS. 4A to 4C are schematic cross-sectional views illustrating light exposure steps performed on the second organic film 115 and manufacturing steps after the light exposure steps.

Figure 3A:
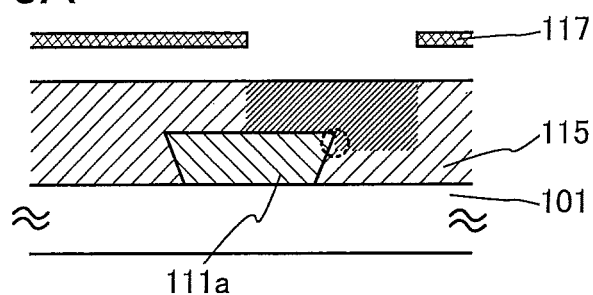
FIGS. 3A to 3C illustrate a method of forming a separation layer according to one embodiment of the present invention.
Figure 3B:
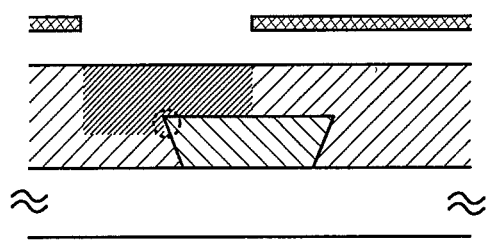

FIGS. 3A and 3B illustrate how light exposure is performed on the second organic film 115. Here, light exposure is performed under the condition that the second organic film 115 is exposed to light down to a portion deeper than the top surface of the leg portion 111*a* in the depth direction.

Figure 3C:
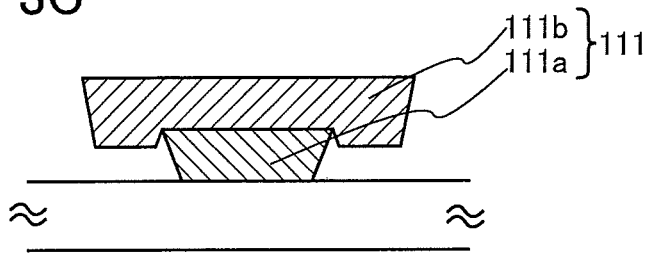

In such a case, light is blocked by the leg portion 111*a* in part of the second organic film 115, which is covered with an upper edge portion of the leg portion 111*a* as indicated by a dashed line in each of FIGS. 3A and 3B; thus, the part is not exposed to the light. Thus, after development treatment, the separation layer 111 having a depressed portion in a region of the stage portion 111*b*, which is in contact with the upper edge portion of the leg portion 111*a*, is formed as illustrated in FIG. 3C.

Forming the separation layer 111 so that an exposed surface of the stage portion 111*b*, which faces the substrate 101, is partly depressed as described above effectively blocks incoming particles (e.g., atoms, molecules, and ions) even in the case where the amount of entry of a thin film formed over the separation layer 111 into a space between the substrate and the stage portion is extremely large, and thus makes it difficult for a film to be formed in the depressed portion. As a result, the film can be divided without fail.

Figure 4A:
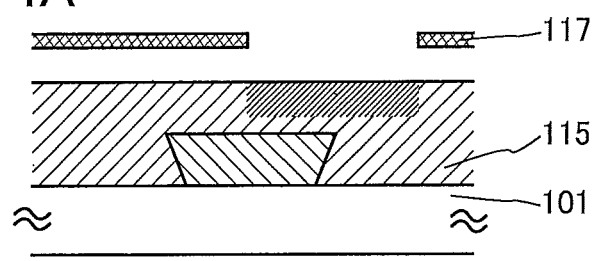
FIGS. 4A to 4C illustrate a method of forming a separation layer according to one embodiment of the present invention.
Figure 4B:
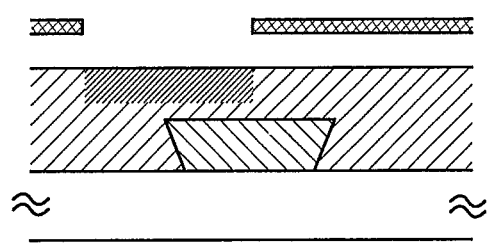

In contrast, in FIGS. 4A and 4B, light exposure is performed on the second organic film 115 so that a region at a depth that does not reach the upper surface of the leg portion 111*a* is exposed to light in the depth direction of the second organic film 115.

Figure 4C:
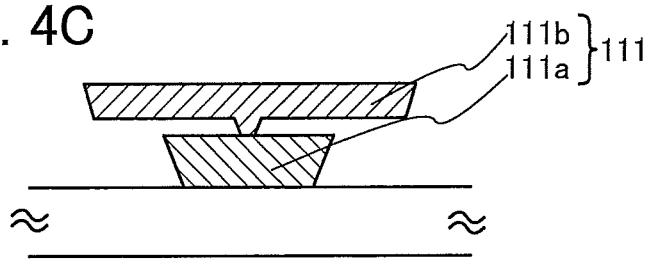

When such light exposure is performed, the second organic film 115 is exposed to light down to a portion in contact with the upper surface of the leg portion 111*a* only in an overlapping portion between two regions exposed to light. Thus, as illustrated in FIG. 4C, after development treatment, part of the bottom surface of the stage portion 111*b*, which faces the substrate 101, projects to be in contact with the upper surface of the leg portion 111*a*, and the upper surface of the leg portion 111*a* and the bottom surface of the stage portion 111*b* face each other with a space therebetween.

Forming the separation layer 111 so that an exposed surface of the stage portion 111*b*, which faces the substrate 101, extends to a region overlapping with the leg portion 111*a* as described above effectively blocks incoming particles (e.g., atoms, molecules, and ions) even in the case where the entry of a thin film formed over the separation layer 111 in forming the thin film is extremely large, and thus makes it difficult for the film to enter a space between the leg portion 111*a* and the stage portion 111*b*. As a result, the film can be divided without fail.

Note that in the formation method described as an example in this embodiment, the order of the plurality of light exposure steps performed on the second organic film 115 is not limited and may be changed. In the other embodiments described below, the order of the light exposure steps can be changed unless otherwise specified.

According to the formation method of the separation layer, which is described as an example in this embodiment, a separation layer having an eaves portion can be formed stably with the use of one light-exposure mask. In addition, the characteristic shape of the separation layer, which is formed by the formation method described as an example in this embodiment, allows a thin film formed over the separation layer to be divided without fail.

Note that this embodiment can be combined with any of the other embodiments and example described in this specification as appropriate.

Embodiment 2

By applying the formation method of the separation layer having an eaves portion, which is described as an example in Embodiment 1, a separation layer with a different shape can be formed. In this embodiment, an application example of the formation method will be described with reference to FIGS. 5A to 5C and FIGS. 6A to 6E.

FIGS. 5A to 5C and FIGS. 6A to 6E are schematic cross-sectional views illustrating light exposure steps performed on the second organic film 115 and manufacturing steps after the light exposure steps.

Figure 5A:
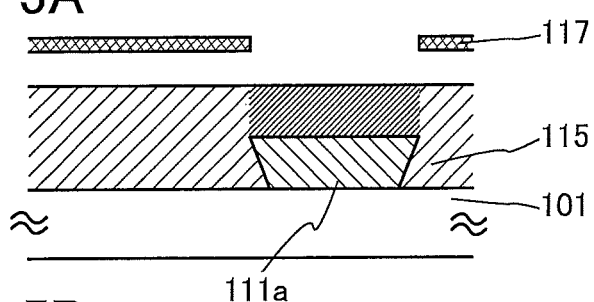
FIGS. 5A to 5C illustrate a method of forming a separation layer according to one embodiment of the present invention.
Figure 5B:
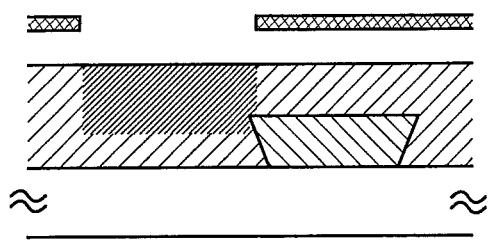

FIGS. 5A and 5B illustrate how light exposure is performed on the second organic film 115.

First, as illustrated in FIG. 5A, first light exposure is performed on the second organic film 115 so that an opening portion of the light-exposure mask 117 overlaps with the leg portion 111*a*.

Then, as illustrated in FIG. 5B, the light-exposure mask 117 is moved parallel to the substrate 101, and second light exposure is performed. At this time, it is preferable that the second light exposure be performed so that a region on which the second light exposure is performed partly overlaps with a region on which the first light exposure is performed.

Figure 5C:
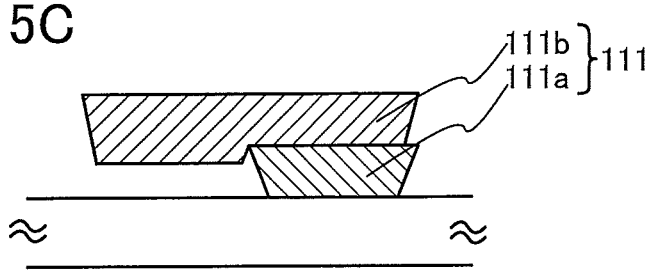

The above light exposure makes it possible to form the separation layer 111 in which only one side of the stage portion 111*b* formed by development treatment projects beyond the leg portion 111*a*, as illustrated in FIG. 5C. For example, the separation layer 111 with such a shape is preferable in the case where a thin film formed over the separation layer 111 is divided on only one side of the separation layer 111.

FIGS. 6A to 6D illustrate how light exposure is performed on the second organic film 115.

Figure 6A:
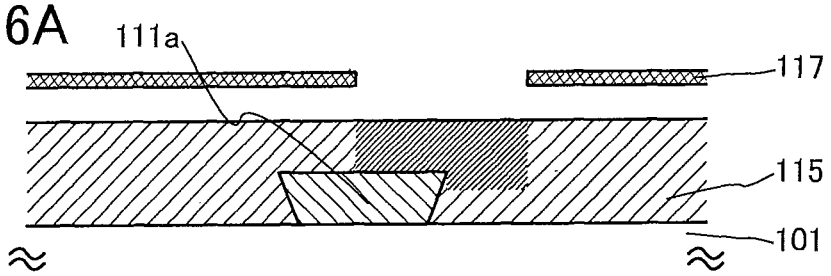
FIGS. 6A to 6E illustrate a method of forming a separation layer according to one embodiment of the present invention.
Figure 6B:
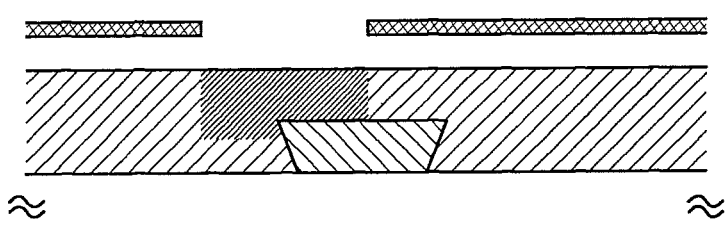

First, by the method described as an example in Embodiment 1, first light exposure is performed on a region overlapping with one edge of the upper surface of the leg portion 111*a* (FIG. 6A) and second light exposure is performed on a region overlapping with the other edge of the upper surface of the leg portion 111*a* (FIG. 6B).

Figure 6C:
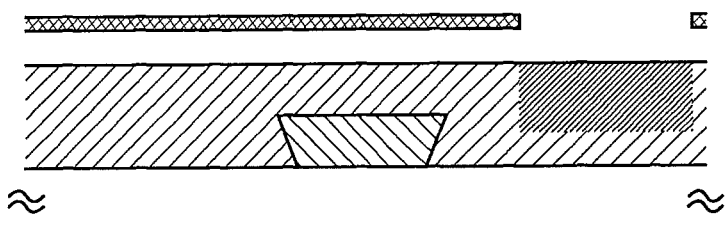

Then, third light exposure is performed on a region positioned on the outer side of the region on which the first light exposure is performed, with respect to the leg portion 111*a* (FIG. 6C). Here, it is preferable that the third light exposure be performed so that the region on which the third light exposure is performed partly overlaps with the region on which the first light exposure is performed.

Figure 6D:
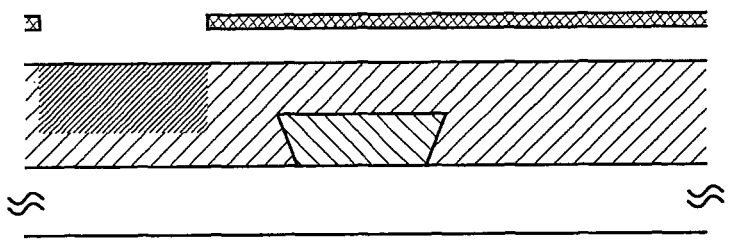

In addition, fourth light exposure is performed on a region positioned on the outer side of the region on which the second light exposure is performed (FIG. 6D).

Figure 6E:
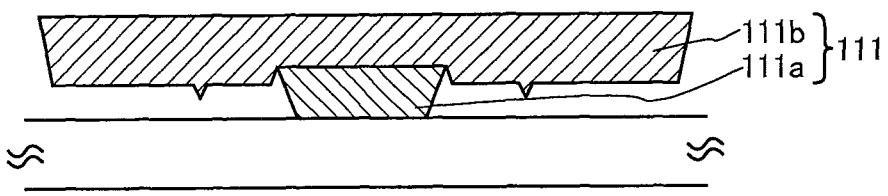

The above light exposure steps allow the area of an exposed surface of the stage portion 111*b* formed by development treatment, which faces the substrate 101, to be extremely large, as illustrated in FIG. 6E. Thus, it is difficult for a thin film formed over the separation layer 111 with such a shape to be formed in an entire region covered by a projection region of the stage portion 111*b* even in the case where the amount of entry of the thin film into the region covered by the projecting region is large. As a result, the thin film can be divided without fail.

Note that when such light exposure steps are performed, the second organic film 115 is exposed to light down to a deep region in the depth direction in a region where portions exposed to light in the light exposure steps overlap with each other; thus, as illustrated in FIG. 6E, part of the a surface of the stage portion 111*b*, which faces the substrate 101, has a projection shape in some cases.

Further, when another light exposure is performed on a region positioned on the outer side of the region on which the third light exposure or the fourth light exposure is performed, the stage portion 111b can be further extended in the direction parallel to the substrate 101.

Note that as another application example, light exposure is performed on the second organic film 115 plural times by changing the depth of an exposed portion of the second organic film 115, whereby the separation layer 111 having a thick region and a thin region in the stage portion 111b can be formed.

Note that this embodiment can be combined with any of the other embodiments and example described in this specification as appropriate.

Embodiment 3

In this embodiment, an example in which any of the separation layers described as examples in the above embodiments is used in an EL light-emitting device will be described with reference to FIGS. 7A and 7B.

Figure 7A:
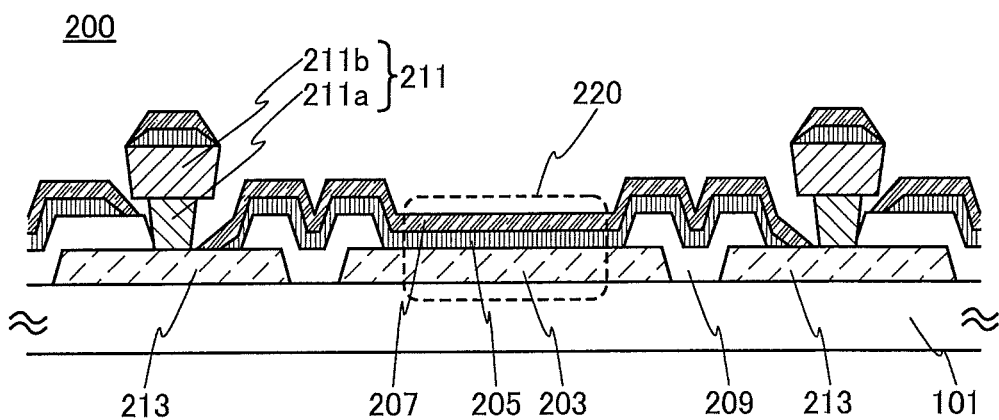
FIGS. 7A and 7B illustrate a light-emitting device according to one embodiment of the present invention.

FIG. 7A is a schematic cross-sectional view of a light-emitting device 200 including an EL element according to one embodiment of the present invention. The light-emitting device 200 includes at least a light-emitting element 220 including a stacked layer of a lower electrode layer 203, an EL layer 205, and an upper electrode layer 207. In addition, the light-emitting device 200 includes a wiring 213 electrically connected to the upper electrode layer 207, a separation layer 211 provided over the wiring 213, and a partition wall 209 covering an edge portion of the lower electrode layer 203 and an edge portion of the wiring 213.

Voltage is applied between the lower electrode layer 203 and the upper electrode layer 207 to pass current through the EL layer 205 interposed between the lower electrode layer 203 and the upper electrode layer 207, so that the light-emitting element 220 emits light.

In the light-emitting element 220, the electrode layer on the side from which light is extracted is formed using a material having a property of transmitting light emitted from the light-emitting element 220. For example, a conductive material having a light-transmitting property is used for the upper electrode layer 207 in the case of a top emission type, for the lower electrode layer 203 in the case of a bottom emission type, and for both of the electrode layers in the case of a dual emission type.

The partition wall 209 is formed so as to cover an edge portion of the lower electrode layer 203 and an edge portion of the wiring 213. The partition wall 209 is provided for the edge portions of the lower electrode layer 203 and the wiring 213 in order to prevent the EL layer 205 and the upper electrode layer 207 from being broken due to a step of the lower electrode layer 203. For that reason, it is preferable that the partition wall 209 have a forward tapered shape so that a film formed thereover is not broken. In a forward tapered shape, a layer gradually increases in thickness and is in contact with a layer serving as a base.

The separation layer 211 is provided over the wiring 213 and includes a leg portion 211a and a stage portion 211b. Any of the separation layers described as examples in the above embodiments can be used as the separation layer 211. The partition wall 209 covering an edge portion of the wiring 213 extends to be in contact with a side surface of the leg portion 211a, which is on the opposite side to the light-emitting element 220.

The lower electrode layer 203, the wiring 213, the partition wall 209, and the separation layer 211 are formed over the substrate 101, and then films are formed thereover to form the EL layer 205 and the upper electrode layer 207. The EL layer 205 can be formed, for example, by a film formation method such as a vacuum evaporation method. The upper electrode layer 207 can be formed, for example, by a film formation method such as a vacuum evaporation method or a sputtering method.

Each of the EL layer 205 and the upper electrode layer 207 which are formed as described above is physically divided by the separation layer 211 as illustrated in FIG. 7A. Here, when the upper electrode layer 207 is formed so that the amount of entry of the upper electrode layer 207 into a space between the stage portion 211b and the wiring 213 is larger than the amount of entry of the EL layer 205 into the space, an edge portion of the upper electrode layer 207 which is divided by the separation layer 211 extends beyond an edge portion of the EL layer 205 which is also divided by the separation layer 211 to be in contact with a surface of part of the partition wall 209, which is covered by a projecting region of the separation layer 211, or with a surface of the wiring 213.

In order to increase the amount of entry of the upper electrode layer 207 into the space, for example, a method in which the distance between the substrate 101 and a sputtering target or an evaporation source is reduced can be employed. Alternatively, a method in which a sputtering target or an evaporation source is placed obliquely upward with respect to the substrate 101, or a method in which the substrate 101 is moved in the in-plane direction can be employed.

Figure 7B:
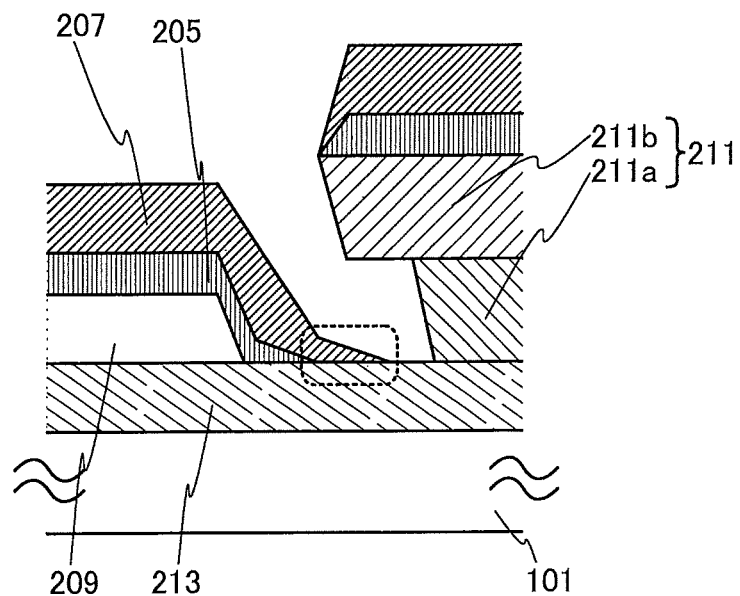

FIG. 7B is a schematic cross-sectional view in which a region where the wiring 213 and the upper electrode layer 207 are connected to each other is enlarged.

A region surrounded by a dashed line in FIG. 7B is a contact portion between the wiring 213 and the upper electrode layer 207. The upper electrode layer 207 is in contact with part of the surface of the wiring 213, which is covered by the projecting region of the separation layer 211, so that the upper electrode layer 207 is electrically connected to the wiring 213. Here, the thickness of part of the upper electrode layer 207, which is in contact with the wiring 213 is smaller than the thickness of part of the upper electrode layer 207, which is in a light-emitting region (a region in which the lower electrode layer 203, the EL layer 205, and the upper electrode layer 207 are stacked). Further, the upper electrode layer 207 may have a so-called forward tapered shape in which the thickness of the contact portion is reduced toward the separation layer 211. When the thickness of the contact portion is small, a contact surface between the upper electrode layer 207 and the wiring 213 can be large even in the case where a space between the side surface of the separation layer 211 and the wiring 213 is small. Thus, the contact resistance can be reduced.

In a conventional manufacturing method of a light-emitting device, the EL layer 205 and the upper electrode layer 207 are formed with the use of a metal mask having an opening portion overlapping with the light-emitting element 220. However, by providing the separation layer 211 according to one embodiment of the present invention as described above, the light-emitting device 200 can be manufactured without using the metal mask. Thus, an increase in cost in the case of using a metal mask and a defect due to contact between the metal mask and a substrate can be prevented. Note that a mask for preventing film formation in the periphery of a substrate, where an extraction electrode or the like is placed, is not directly in contact with the light-emitting region, and thus may be used.

Note that although the separation layer is provided over the wiring so that the wiring and the upper electrode of the light-emitting element are electrically connected to each other in this embodiment, the separation layer may be provided between a plurality of light-emitting elements as an application example of the separation layer. The separation layer is provided between the plurality of light-emitting elements, and an EL film and a conductive film serving as an upper electrode layer are formed thereover, whereby the plurality of light-emitting elements can be electrically separated from each other.

Note that this embodiment can be combined with any of the other embodiments and example described in this specification as appropriate.

Embodiment 4

In this embodiment, one embodiment of a light-emitting device in which any of the separation layers described as examples in the above embodiments is used and one embodiment of a lighting device in which the light-emitting device is used will be described with reference to FIG. 8, FIGS. 9A and 9B, and FIG. 10.

Figure 8:
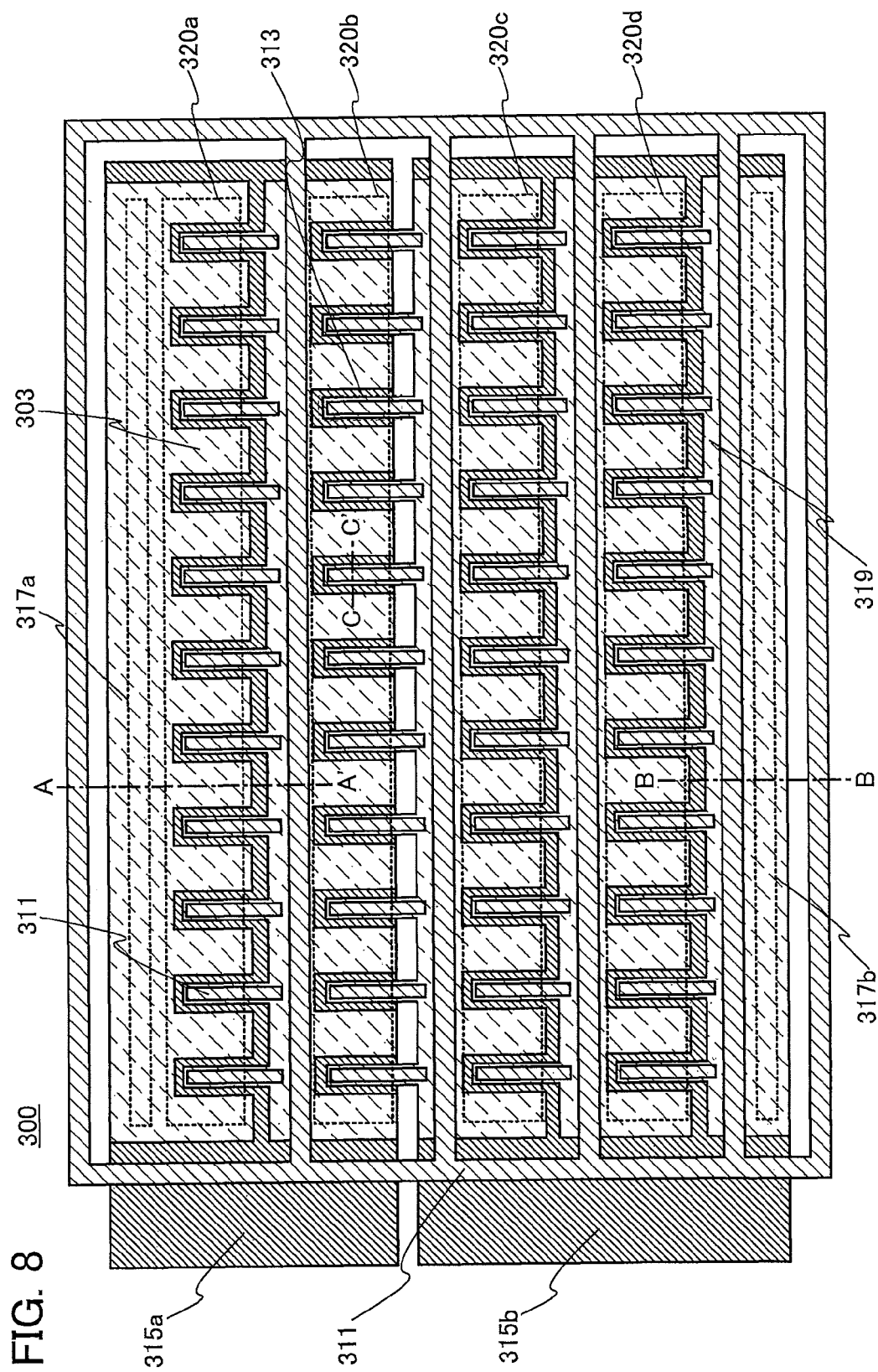
FIG. 8 illustrates a lighting device according to one embodiment of the present invention.

FIG. 8 is a schematic top view of a light-emitting device 300 according to one embodiment of the present invention.

The light-emitting device 300 includes four light-emitting regions (a first light-emitting region 320a, a second light-emitting region 320b, a third light-emitting region 320c, and a fourth light-emitting region 320d) surrounded by a separation layer 311. In the light-emitting device 300, these four light-emitting regions are connected in series.

An EL layer 305, an upper electrode layer 307, and the like are not illustrated in FIG. 8 for simplicity.

In the light-emitting device 300, a lower electrode layer 303 of the first light-emitting region 320a is electrically connected to a wiring 315a through a contact region 317a. In addition, the upper electrode layer 307 (not illustrated) of the fourth light-emitting region 320d is electrically connected to a wiring 315b through a connection wiring 319 and a contact region 317b as described later. Thus, when voltage is applied between the wiring 315a and the wiring 315b, current can flow through the light-emitting regions which are connected in series, so that light emission can be obtained.

Further, in each of the light-emitting regions, a plurality of auxiliary wirings 313 for helping the upper electrode layer 307 (not illustrated) regarding the conductivity are provided in the direction of current flow, and the separation layer 311 is provided over the auxiliary wiring 313. As described later, the upper electrode layer 307 (not illustrated) is electrically connected to the auxiliary wiring 313 in a region where the auxiliary wiring 313 is covered by a projecting region of the separation layer 311.

Figure 10:
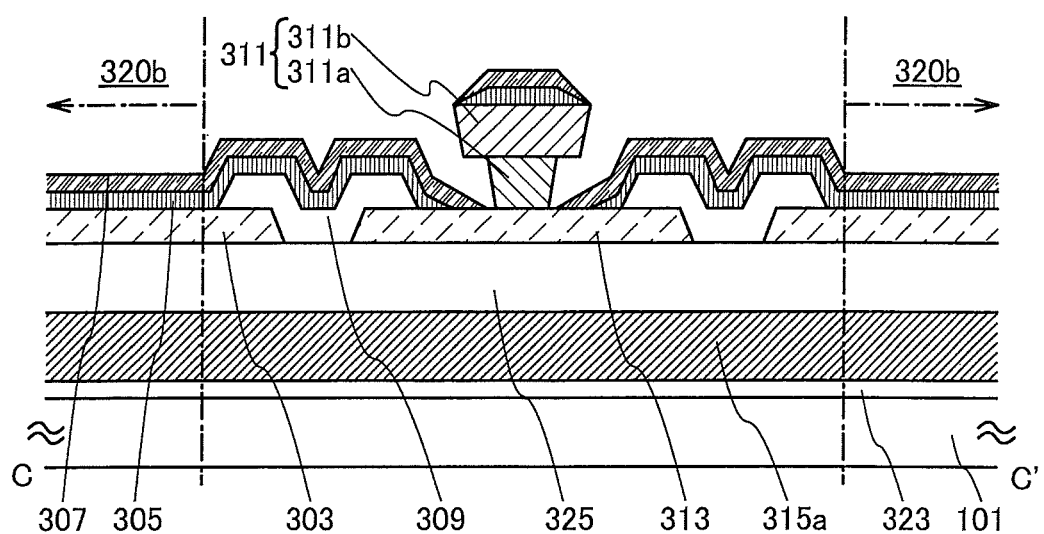
FIG. 10 illustrates the lighting device according to one embodiment of the present invention.

Next, specific description will be given with reference to a schematic cross-sectional view of the light-emitting device 300. FIG. 9A, FIG. 9B, and FIG. 10 are schematic cross-sectional views along line A-A', line B-B', and line C-C' in FIG. 8, respectively.

FIG. 9A is a schematic cross-sectional view along line A-A', which illustrates the separation layer 311 surrounding the periphery of the light-emitting device 300, the contact region 317a, and parts of the first light-emitting region 320a and the second light-emitting region 320b.

In the light-emitting device 300, a base film 323 is provided over the substrate 101, and the wiring 315a and a planarization film 325 covering the base film 323 and the wiring 315a are provided over the base film 323. In the contact region 317a, the lower electrode layer 303 of the first light-emitting region 320a and the wiring 315a are electrically connected to each other through an opening portion formed in the planarization film 325. A partition wall 309 is provided over the lower electrode layer 303 in the contact region 317a so that a step of the lower electrode layer 303 is reduced.

The wiring 315a and the wiring 315b which is described later are provided on the side closer to the substrate 101 than to each light-emitting region, with the planarization film 325 interposed between each light-emitting region and the wirings 315a and 315b, so that the area of a non-light-emitting region in the light-emitting device 300 can be reduced. Further, the wiring 315a and the wiring 315b are provided so as to overlap with an entire region of each light-emitting region, so that unevenness in the light-emitting region can be reduced, which results in the light-emitting device 300 with uniform emission intensity and high visibility.

The separation layer 311 is provided in a region outside the contact region 317a and between the first light-emitting region 320a and the second light-emitting region 320b. The separation layer 311 includes a leg portion 311a and a stage portion 311b. Any of the separation layers described as examples in the above embodiments can be used as the separation layer 311.

The separation layer 311 surrounding the periphery of the light-emitting device 300 is provided over the partition wall 309. Each of the EL layer 305 and the upper electrode layer 307 can be divided by the separation layer 311. The separation layer 311 is provided so as to surround the light-emitting regions as described above, whereby the light-emitting device 300 can be electrically separated from the periphery of the light-emitting device 300. For example, even in the case where a plurality of light-emitting devices 300 are provided adjacent to each other, the plurality of light-emitting devices 300 can be electrically separated from each other by the separation layer 311.

The separation layer 311 between the first light-emitting region 320a and the second light-emitting region 320b is provided over the lower electrode layer 303 of the second light-emitting region 320b. The partition wall 309 is formed in contact with a side surface of the leg portion 311a of the separation layer 311, which is on the light-emitting region 320b side. With such a structure, the lower electrode layer 303 of the second light-emitting region 320b and the upper electrode layer 307 of the first light-emitting region 320a are electrically connected to each other in a region covered by the projecting region of the separation layer 311. Thus, the first light-emitting region 320a and the second light-emitting region 320b are connected in series.

The separation layer 311 is provided between the other adjacent light-emitting regions to form the structure described above, so that the four light-emitting regions in the light-emitting device 300 can be connected in series.

FIG. 9B is a schematic cross-sectional view along line B-B', which illustrates part of the fourth light-emitting region 320d, a contact region 317b, and the separation layer 311 surrounding the periphery of the light-emitting device 300.

In FIG. 9B, as in FIG. 9A, the separation layer 311 is provided over the partition wall 309 also in a region outside the contact region 317b. The separation layer 311 surrounding the periphery of the light-emitting device 300 allows the light-emitting device 300 to be electrically separated from the outside.

Further, in the contact region 317b, as in the contact region 317a, the wiring 315b and the connection wiring 319 are electrically connected to each other. The partition wall 309 covering the contact region 317b extends over the connection wiring 319; thus, a region where the connection wiring 319 is provided does not serve as a light-emitting element.

The separation layer 311 is provided over part of the connection wiring 319, which is close to the fourth light-emitting region 320d. Thus, the upper electrode layer 307 of the fourth light-emitting region 320d and the connection wiring 319 are electrically connected in a region covered by the projecting region of the separation layer 311 as in the case of the connection between the light-emitting regions.

FIG. 10 is a schematic cross-sectional view along line C-C' cutting across the auxiliary wiring 313 in the second light-emitting region 320b.

The auxiliary wiring 313 is formed from the same layer as the lower electrode layer 303 of the second light-emitting region 320b. The partition wall 309 is provided so as to cover an edge portion of the auxiliary wiring 313 and an edge portion of the lower electrode layer 303.

The separation layer 311 is provided over the auxiliary wiring 313. Thus, the upper electrode layer 307 of the second light-emitting region 320b and the auxiliary wiring 313 are electrically connected in a region covered by the projecting region of the separation layer 311. With such a structure, the auxiliary wiring 313 can help the upper electrode layer 307 regarding the conductivity.

In particular, in the case where a material with high electric resistance, such as an oxide conductor having a light-transmitting property, is used for the upper electrode layer 307, a voltage drop is caused due to the resistance of the upper electrode layer 307, which results in non-uniform emission intensity in the light-emitting device 300. Thus, providing the auxiliary wiring 313 in the light-emitting region in the direction of current flow is particularly effective.

Note that a sealing film covering at least the upper electrode layer 307 is preferably provided in the light-emitting device 300. The formation of the sealing film can suppress the entry of external impurities such as water; thus, the light-emitting device 300 can have high reliability.

As described above, by using the separation layer of one embodiment of the present invention, the light-emitting device 300 can be manufactured without a metal mask which might be in contact with a light-emitting region or a peripheral portion thereof. Thus, an increase in cost in the case of using a metal mask and a defect due to contact between the metal mask and a substrate can be prevented.

Further, in the light-emitting device of one embodiment of the present invention, two light-emitting regions can be connected in series by providing any of the separation layers described as examples in the above embodiments to be in contact with a lower electrode layer of one of the light-emitting regions between the two light-emitting regions. For example, in a lighting device including light-emitting devices, converter is used for converting power supply voltage for home use into voltage for driving the lighting device; in the case where the driving voltage of the light-emitting devices is low, the conversion efficiency of the converter is low. Thus, the light-emitting devices in the lighting device are connected in series, whereby the driving voltage of the lighting device can be increased and power loss in conversion by the converter can be reduced.

Note that although the two light-emitting regions are connected in series with the separation layer interposed therebetween in this embodiment, a structure may be employed in which the separation layer, which is not in contact with any lower electrode layers, is provided between the two light-emitting regions (light-emitting elements) so that the two light-emitting regions are electrically separated. In this case, an EL film and a conductive film serving as an upper electrode layer are formed over a region including a lower electrode layer and the separation layer, so that the light-emitting elements adjacent to each other can be electrically separated from each other.

<Materials and Formation Methods of Components>

Examples of materials that can be used for components in the light-emitting device 300 and formation methods of the components will be described below.

[Substrate]

In the case where the light-emitting device 300 is a bottom emission type or a dual emission type, a material having a light-transmitting property such as glass, quartz, or an organic resin can be used as a material of the substrate 101. In the case of a top emission type, a light-transmitting property is not always necessary, and a material such as a metal, a semiconductor, ceramics, and a colored organic resin can be used other than the above materials. In the case where a conductive substrate is used, the substrate preferably has an insulating property by oxidation of its surface or formation of an insulating film over the surface.

In the case where an organic resin is used for the substrate 101, for example, a polyester resin such as polyethylene terephthalate (PET) or polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used as an organic resin. A substrate in which a glass fiber is impregnated with an organic resin or a substrate in which an inorganic filler is mixed with an organic resin can also be used.

In particular, in the case where the light-emitting device 300 is a top emission device, a substrate having high thermal conductivity, such as a metal substrate, is preferably used. In the case of a large lighting device including an EL element, heat from the EL element might become a problem. In view of the above, such a substrate having high thermal conductivity is used to increase heat dissipation. For example, when a substrate of aluminum oxide, duralumin, or the like is used other than a stainless steel substrate, light weight and high thermal dissipation can be achieved. A stack of aluminum and aluminum oxide, a stack of duralumin and aluminum oxide, a stack of duralumin and magnesium oxide, or the like is preferably used, in which case the surface of the substrate can have an insulating property.

[Sealing Film and Base Film]

In the case of a bottom-emission or dual-emission light-emitting device, a sealing film and a base film can be formed using a material having a light-transmitting property and a barrier property. In the case of a top-emission light-emitting device, a light-transmitting property is not always necessary.

As each of the sealing film and the base film, for example, an inorganic insulating film can be formed by a sputtering method. For example, a silicon nitride film, an aluminum oxide film, a silicon oxide film, or the like may be formed. The sealing film or the base film which is provided on the side opposite to the side from which light is extracted may be a stack of a metal film and the above inorganic insulating film.

The sealing film is preferably a gas barrier film in which the permeability of moisture is lower than or equal to $10^{-6}$ $g/m^2 \cdot day$, for example. For example, a stacked-layer structure in which at least one layer containing an inorganic material is provided between layers containing an organic material can be used for the sealing film. As an example of the layer containing an organic material, an adhesive layer such as an epoxy-based adhesive layer can be given. As an example of the layer containing an inorganic material, a film with a barrier property, such as a silicon oxide film or a silicon nitride film can be given.

When an organic resin is used for a substrate, a glass layer with a thickness greater than or equal to 25 μm and less than or equal to 100 μm may be used as a base layer. The thickness of the glass layer is typically greater than or equal to 45 μm and less than or equal to 80 μm. By combining an organic resin substrate and a glass layer, moisture, an impurity, or the like can be prevented from entering an organic compound or a metal material included in the light-emitting element from the outside of the light-emitting unit, and the weight of the light-emitting unit can be reduced.

[Separation Layer]

The separation layer can be formed by any of the methods described as examples in the above embodiment. The separation layer can be formed using, for example, a resin material having a negative photosensitivity. As the resin material, for example, a novolac resin or a phenol resin can be used as well as a resin material such as polyimide, acrylic, polyamide, or epoxy.

[Light-Emitting Element]

As a light-transmitting material which can be used for an electrode layer through which light is extracted, indium oxide, indium tin oxide (ITO), indium zinc oxide, zinc oxide, zinc oxide to which gallium is added, graphene, or the like can be used Alternatively, for the electrode layer, a metal material such as gold, silver, platinum, magnesium, nickel, tungsten, chromium, molybdenum, iron, cobalt, copper, palladium, or titanium, or an alloy of any of these metal materials can be used. Further alternatively, a nitride of the metal material (e.g., titanium nitride) or the like may be used. In the case of using the metal material (or the nitride thereof), the electrode layer may be thinned so as to be able to transmit light.

Further, a stacked film of any of the above materials can be used as the electrode layer. For example, a stacked film of ITO and an alloy of silver and magnesium is preferably used, in which case the conductivity can be increased.

The thickness of the electrode layer through which light is extracted is, for example, greater than or equal to 50 nm and less than or equal to 300 nm, preferably greater than or equal to 80 nm and less than or equal to 130 nm, more preferably greater than or equal to 100 nm and less than or equal to 110 nm.

An EL layer includes at least a layer containing a light-emitting organic compound. In addition, the EL layer can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

Note that in one embodiment of the present invention, a light-emitting element (a tandem light-emitting element) in which a plurality of EL layers are provided between an upper electrode layer and a lower electrode layer can be used. A stacked-layer structure of two layers, three layers, or four layers (in particular, three layers) is preferably used. Examples of structures of the EL layer will be described in detail in Embodiment 6.

An electrode layer which is provided on the side opposite to the side from which light is extracted is formed using a material having a reflective property. As the material having the reflective property, a metal material such as aluminum, gold, platinum, silver, nickel, tungsten, chromium, molybdenum, iron, cobalt, copper, or palladium can be used. Any of the following can also be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium, titanium oxide, and the like are given.

A stack of a film formed of any of the above light-transmitting material and a film formed of a metal material may also be used. For example, a stack of silver and ITO, a stack of an alloy of silver and magnesium and ITO, or the like can be used.

[Wiring]

As the wiring, a single layer or a stacked layer using a material selected from copper (Cu), titanium (Ti), tantalum (Ta), tungsten (W), molybdenum (Mo), chromium (Cr), neodymium (Nd), scandium (Sc), and nickel (Ni) or an alloy material including any of these materials as its main component can be used. Aluminum can also be used for the material of the wiring; however, in that case, the wiring might be corroded when the wiring is provided to be in direct contact with ITO or the like. For that reason, it is preferable that the wiring have a stacked-layer structure and that aluminum be used for a layer which is not in contact with ITO or the like. Copper can be preferably used because of its low resistance. The thickness of the wiring is preferably greater than or equal to 100 nm and less than or equal to 35 μm.

A deposition method such as a sputtering method or a vacuum evaporation method can be used as appropriate as a method of forming a conductive film used for the light-emitting element or the wiring. If possible, a droplet discharge method such as a screen printing method or an inkjet method, a plating method, or the like can also be used.

[Partition Wall]

As a material of the partition wall, for example, an organic resin such as polyimide, acrylic, polyamide, epoxy, a novolac resin, or a phenol resin, or an inorganic insulating material containing a semiconductor oxide or a semiconductor nitride, such as silicon oxide, silicon nitride, silicon oxynitride, or silicon nitride oxide can be used.

The angle of a sidewall surface of a layer whose edge portion with a forward tapered shape is in contact with a layer to be a base is greater than or equal to 10° and less than or equal to 85°, preferably greater than or equal to 60° and less than or equal to 80°.

It is particularly preferable that the partition wall be formed using a photosensitive resin material to have an opening portion so that a sidewall of the opening portion is formed as an inclined surface with continuous curvature. Specifically, the radius of curvature of a curve drawn by a cross section of an insulating film is desirably approximately 0.2 μm to 2 μm.

There is no particular limitation on the method for forming the partition wall. A sputtering method, an evaporation method, a coating method, a droplet discharge method (inkjet method), a screen printing method, an offset printing method, or the like may be used.

The thickness of the partition wall may be, for example, greater than or equal to 20 nm and less than or equal to 20 μm, preferably greater than or equal to 50 nm and less than or equal to 3 μm.

[Planarization Film]

The planarization film can be formed using an inorganic insulating material or an organic insulating material. Note that a heat-resistant organic insulating material such as an acrylic resin, polyimide, a benzocyclobutene-based resin, polyamide, or an epoxy resin is preferably used as a planarization insulating film. Other than the above organic insulating materials, it is possible to use a low-dielectric constant material (a low-k material), a siloxane-based resin, phosphosilicate glass (PSG), borophosphosilicate glass (BPSG), or the like. Note that the planarization film may be formed by stacking a plurality of insulating films formed using these materials.

There is no particular limitation on the method for forming the planarization film. A sputtering method, a spin coating method, a dipping method, a printing method, an inkjet method, or the like can be used depending on the material.

Note that this embodiment can be combined with any of the other embodiments and example described in this specification as appropriate.

Embodiment 5

In this embodiment, an example of a top-emission lighting device in which any of the light-emitting devices described as examples in the above embodiments is used will be described with reference to FIGS. 11A and 11B.

Figure 11A:
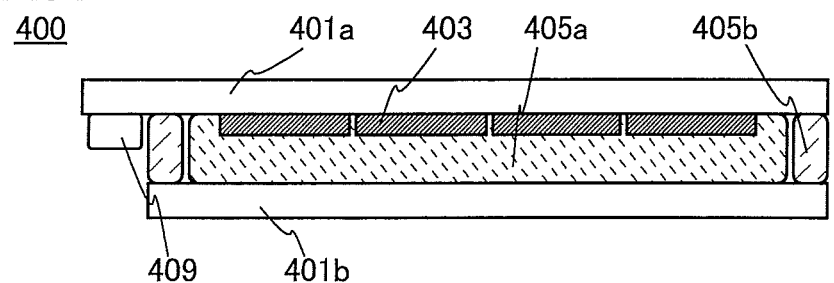
FIGS. 11A and 11B each illustrate a lighting device according to one embodiment of the present invention.

In a lighting device 400 illustrated in FIG. 11A, a plurality of light-emitting devices 403 are formed on a first substrate 401a. The first substrate 401a and a second substrate 401b having a light-transmitting property, which face each other, are attached to each other with a sealant 405a covering the light-emitting devices 403 and a sealant 405b provided at an end portion of the substrates.

Any of the light-emitting devices described as examples in the above embodiments can be used as the light-emitting device 403 as appropriate.

It is preferable that a substrate having high thermal conductivity, such as a metal substrate, be used as the first substrate 401a. In the case of a large lighting device including an EL element, heat from the EL element becomes a problem in some cases. In view of the above, such a substrate having high thermal conductivity is used to increase heat dissipation. For example, when a substrate of aluminum oxide, duralumin, or the like is used other than a stainless steel substrate, light weight and high thermal dissipation can be achieved. A stack of aluminum and aluminum oxide, a stack of duralumin and aluminum oxide, a stack of duralumin and magnesium oxide, or the like is preferably used, in which case the surface of the substrate can have an insulating property.

A light-transmitting substrate is used as the second substrate 401b. An uneven structure may be provided on a surface intersecting with light emitted from the light-emitting device 403, such as a surface of the light-emitting device 403 or top and bottom surfaces of the second substrate 401b in order to prevent total reflection. For example, a hemispherical lens, a micro lens array, a film provided with an uneven structure, a light diffusing film, or the like may be attached, or an uneven structure may be directly formed.

As each of the sealants 405a and 405b, a material which can attach facing surfaces to each other can be used. For example, a known sealant formed of a thermosetting material, an ultraviolet curable material, or the like can be used. In particular, a light-transmitting material is preferably used for the sealant 405a. A material used for these is desirably a material which transmits as little moisture or oxygen as possible. A sealant containing a desiccating agent can also be used.

Figure 11B:
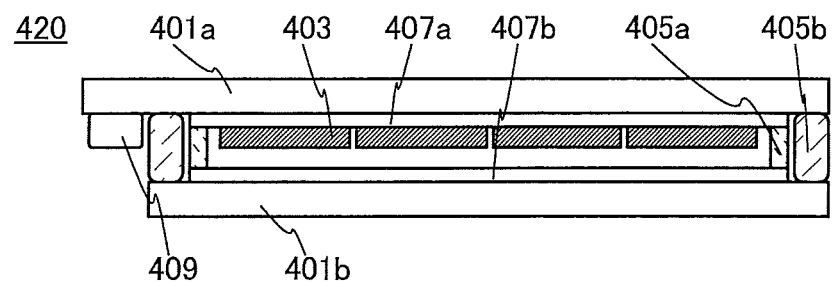

In a lighting device 420 illustrated in FIG. 11B, a structure in which the plurality of light-emitting devices 403 formed on a first glass layer 407a on the first substrate 401a is sealed with a second glass layer 407b is surrounded by the first substrate 401a and the second substrate 401b.

The first glass layer 407a and the second glass layer 407b are attached to each other with the sealant 405a. The first substrate 401a and the second substrate 401b are attached to each other with the sealant 405b.

Further, a space between the first glass layer 407a and the second glass layer 407b may be filled with a filler such as an inert gas (e.g., nitrogen or argon) or a sealant having a light-transmitting property.

Since the light-emitting devices 403 are sealed between the two thin glass layers in the lighting device 420, the entry of an impurity such as moisture or oxygen from the outside can be suppressed. Thus, the lighting device 420 can have high reliability.

Further, each of the lighting device 400 and the lighting device 420 is provided with a converter 409, which is connected to the light-emitting devices 403, on the first substrate 401a. The converter 409 converts, for example, power supply voltage for home use into power supply voltage for driving the lighting device. Note that the converter 409 may be formed on the inner side of the sealant 405b.

Further, a material having flexibility, such as plastic, an organic resin film, a thin glass substrate, or a metal thin film, is used as a material of the substrates used for the lighting devices 400 and 420, whereby the lighting device can be light and flexible.

Note that although a top-emission lighting device is described in this embodiment, in the case of a bottom-emission lighting device, for example, a substrate for which a light-emitting device is provided may have a light-transmitting property.

Note that this embodiment can be combined with any of the other embodiments and example described in this specification as appropriate.

Embodiment 6

In this embodiment, examples of EL layers that can be applied to one embodiment of the present invention will be described with reference to FIGS. 12A to 12C.

Figure 12A:
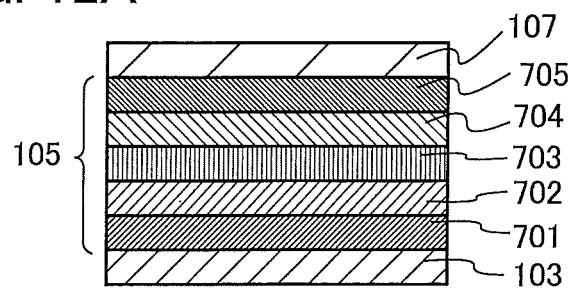
FIGS. 12A to 12C each illustrate an EL layer according to one embodiment of the present invention.

As illustrated in FIG. 12A, the EL layer 105 is provided between the first electrode 103 and the second electrode 107. The first electrode 103 and the second electrode 107 can have a structure similar to that of the lower electrode layer or the upper electrode layer, which is described as an example in the above embodiment.

A light-emitting element including the EL layer 105, which is described as an example in this embodiment, can be used as any of the light-emitting elements and in any of the light-emitting devices and lighting devices which are described as examples in the above embodiments.

The EL layer 105 includes at least a light-emitting layer containing a light-emitting organic compound. In addition, the EL layer 105 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, in the EL layer 105, a hole-injection layer 701, a hole-transport layer 702, a layer 703 containing a light-emitting organic compound, an electron-transport layer 704, and an electron-injection layer 705 are stacked in this order from the first electrode 103 side. Note that the stacking order may be inversed.

A manufacturing method of the light-emitting element illustrated in FIG. 12A will be described.

The hole-injection layer 701 is a layer containing a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$), or copper(II) phthalocyanine (abbreviation: CuPc) can also be used.

Any of the following aromatic amine compounds which are low molecular organic compounds can be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)-amino]-9-phenylcarbazole (abbreviation: PCzPCN1).

Any of high molecular compounds (e.g., oligomers, dendrimers, or polymers) can also be used. As examples of the high molecular compounds, the following are given: poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}-phenyl)methacrylamide] (abbreviation: PTPDMA), poly[N,N'-bis(4-butylphenyl)-N,N'-bis(phenyl)benzidine] (abbreviation: Poly-TPD), and the like. A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, for the hole-injection layer 701, a composite material in which an acceptor substance is mixed with an organic compound having a high hole-transport property is preferably used. With the use of the composite material in which an acceptor substance is added to a substance having a high hole-transport property, excellent hole injection from the first electrode 103 can be obtained, which results in a reduction in the drive voltage of the light-emitting element. Such a composite material can be formed by co-evaporation of a substance having a high hole-transport property and an acceptor substance. When the hole-injection layer 701 is formed using the composite material, holes are easily injected from the first electrode 103 into the EL layer 105.

As the organic compound used for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole-transport property. Specifically, a substance having a hole mobility of $10^{-6}$ cm$^2$/Vs or higher is preferably used. Note that any other substances may also be used as long as the hole-transport property thereof is higher than the electron-transport property thereof. Specific examples of the organic compounds that can be used for the composite material are given below.

As the organic compound that can be used for the composite material, any of the following can be used: aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives, such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Any of the following aromatic hydrocarbon compounds can also be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Any of the following aromatic hydrocarbon compounds can also be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA).

Further, as examples of the electron acceptor, organic compounds such as 7,7,8,8-tetracyano-2,3,5,6-tetrafluoroquinodimethane (abbreviation: $F_4$-TCNQ) and chloranil; and transition metal oxides can be given. In addition, oxides of metals belonging to Groups 4 to 8 in the periodic table can be also given. Specifically, vanadium oxide, niobium oxide, tantalum oxide, chromium oxide, molybdenum oxide, tungsten oxide, manganese oxide, and rhenium oxide are preferable because of their electron-accepting properties. Among these, molybdenum oxide is particularly preferable because it is stable in the air, has a low hygroscopic property, and is easily handled.

The composite material may be formed using the above-described electron acceptor and the above-described high molecular compound such as PVK, PVTPA, PTPDMA, or Poly-TPD and used for the hole-injection layer 701.

The hole-transport layer 702 is a layer containing a substance having a high hole-injection property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'- bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substances may also be used as long as the hole-transport property thereof is higher than the electron-transport property thereof. Note that the layer containing a substance having a high hole-transport property is not limited to a single layer and may be a stack of two or more layers containing any of the above substances.

A carbazole derivative such as CBP, CzPA, or PCzPA or an anthracene derivative such as t-BuDNA, DNA, or DPAnth may also be used for the hole-transport layer 702.

A high molecular compound such as PVK, PVTPA, PTP-DMA, or Poly-TPD can also be used for the hole-transport layer 702.

For the layer 703 containing a light-emitting organic compound, a fluorescent compound which exhibits fluorescence or a phosphorescent compound which exhibits phosphorescence can be used.

As the fluorescent compound that can be used for the layer 703 containing a light-emitting organic compound, a material for blue light emission, a material for green light emission, a material for yellow light emission, and a material for red light emission are given. As examples of the material for blue light emission, the following are given: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. As examples of the material for green light emission, the following are given: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like. As examples of the material for yellow light emission, rubrene, 5,12-bis(1,1'-biphenyl-4-yl)-6,11-diphenyltetracene (abbreviation: BPT), and the like are given. As examples of the material for red light emission, N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), and the like are given.

As the phosphorescent compound that can be used for the layer 703 containing a light-emitting organic compound, a material for blue light emission, a material for green light emission, a material for yellow light emission, a material for orange light emission, and a material for red light emission are given. As examples of the material for blue light emission, the following are given: bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), bis[2-(4',6'-difluorophenyl)pyridinato-N,C$^{2'}$]iridium(III)acetylacetonate (abbreviation: FIr(acac)), and the like. As examples of the material for green light emission, the following are given: tris(2-phenylpyridinato-N,C$^{2'}$)iridium(III) (abbreviation: Ir(ppy)$_3$), bis[2-phenylpyridinato-N,C$^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. As examples of the material for yellow light emission, the following are given: bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)) (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. As examples of the material for orange light emission, the following are given: tris(2-phenylquinolinato-N,C$^{2'}$) iridium (III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: Ir(mppr-iPr)$_2$(acac)), and the like. As examples of the material for red light emission, organometallic complexes such as bis[2-(2'-benzo[4,5-a]thienyl)pyridinato-N,C$^{3'}$)iridium(III)acetylacetonate (abbreviation: [Ir(btp)$_2$(acac)]), bis(1-phenylisoquinolinato-N,C$^{2'}$)iridium (III)acetylacetonate (abbreviation: [Ir(piq)$_2$(acac)]), (acetylacetonato)bis[2,3-bis(4-fluorophenyl)quinoxalinato]iridium(III) (abbreviation: [Ir(Fdpq)$_2$(acac)]), (acetylacetonato)bis(2,3,5-triphenylpyrazinato)iridium(III) (abbreviation: [Ir(tppr)$_2$(acac)]), (dipivaloylmethanato)bis(2,3,5-triphenylpyrazinato)iridium(III) (abbreviation: [Ir(tppr)$_2$(dpm)]), and (2,3,7,8,12,13,17,18-octaethyl-21H,23H-porphyrin)platinum(II) (abbreviation: PtOEP). As a material for red light emission, the following organometallic complexes can be used: bis[2-(2'-benzo[4,5-α]thienyl)pyridinato-N,C$^{3'}$)iridium (III)acetylacetonate (abbreviation: [Ir(btp)$_2$(acac)]), bis(1-phenylisoquinolinato-N,C$^{2'}$)iridium (III)acetylacetonate (abbreviation: [Ir(piq)$_2$(acac)]), (acetylacetonato)bis[2,3-bis(4-fluorophenyl)quinoxalinato]iridium(III) (abbreviation: [Ir(Fdpq)$_2$(acac)]), (acetylacetonato)bis(2,3,5-triphenylpyrazinato)iridium(III) (abbreviation: [Ir(tppr)$_2$(acac)]), (dipivaloylmethanato)bis(2,3,5-triphenylpyrazinato)iridium(III) (abbreviation: [Ir(tppr)$_2$(dpm)]), and (2,3,7,8,12,13,17,18-octaethyl-21H,23H-porphyrin)platinum(II) (abbreviation: PtOEP). In addition, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the layer 703 containing a light-emitting organic compound may have a structure in which the above light-emitting organic compound (a guest material) is dispersed in another substance (a host material). As a host material, a variety of kinds of materials can be used, and it is preferable to use a substance which has a higher lowest unoccupied molecular orbital level (LUMO level) than the light-emitting material and has a lower highest occupied molecular orbital level (HOMO level) than the light-emitting material.

As specific examples of the host material, the following are given: metal complexes such as tris(8-quinolinolato)aluminum(III) (abbreviation: Alq), tris(4-methyl-8-quinolinolato) aluminum (III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyfldiphenanthrene (abbreviation: DPNS), 9,9'-(stilbene-4,4'-diyl)diphenanthrene (abbreviation: DPNS2), 3,3',3"-(benzene-1,3,5-triyfltripyrene (abbreviation: TPB3), 9,10-diphenylanthracene (abbreviation: DPAnth), and 6,12-dimethoxy-5,11-diphenylchrysene; aromatic amine compounds such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB; and the like.

Plural kinds of materials can be used as the host material. For example, in order to suppress crystallization, a substance such as rubrene which suppresses crystallization may be further added. In addition, NPB, Alq, or the like may be further added in order to efficiently transfer energy to the guest material.

When a structure in which a guest material is dispersed in a host material is employed, crystallization of the layer 703 containing a light-emitting organic compound can be suppressed. Further, concentration quenching due to high concentration of the guest material can be suppressed.

A high molecular compound can also be used for the layer 703 containing a light-emitting organic compound. Specifically, a material for blue light emission, a material for green light emission, and a material for orange to red light emission are given. As examples of the material for blue light emission, the following are given: poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. As examples of the material for green light emission, the following are given: poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], and the like. As examples of the material for orange to red light emission, the following are given: poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Further, by providing a plurality of layers each containing a light-emitting organic compound and making the emission colors of the layers different, light emission having a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that "complementary colors" refer to colors that can produce an achromatic color when mixed. In other words, when lights obtained from substances which emit light of complementary colors are mixed, white emission can be obtained. This can be applied to a light-emitting element including three or more layers each containing a light-emitting organic compound.

The electron-transport layer 704 is a layer containing a substance having a high electron-transport property. As examples of the substance having a high electron-transport property, the following are given: metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)(4-phenylphenolato)aluminum (abbreviation: BAlq). A metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can also be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances given here are mainly ones that have an electron mobility of $10^{-6}$ cm$^2$/Vs or higher. Note that the electron-transport layer is not limited to a single layer and may be a stack of two or more layers containing any of the above substances.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an inkjet method, or a coating method.

Figure 12B:
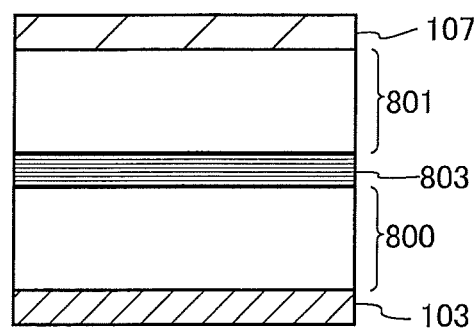

As illustrated in FIG. 12B, a plurality of EL layers may be stacked between the first electrode 103 and the second electrode 107. In that case, a charge generation layer 803 is preferably provided between a first EL layer 800 and a second EL layer 801 which are stacked. The charge generation layer 803 can be formed using the above composite material. Further, the charge generation layer 803 may have a stacked-layer structure including a layer containing the composite material and a layer containing another material. In that case, as the layer containing another material, a layer containing an electron donating substance and a substance having a high electron-transport property, a layer formed of a transparent conductive film, or the like can be used. As for a light-emitting element having such a structure, problems such as energy transfer and quenching hardly occur, and a light-emitting element which has both high emission efficiency and long lifetime can be easily obtained due to expansion in the choice of materials. Moreover, a light-emitting element which provides phosphorescence from one EL layer and fluorescence from another EL layer can be easily obtained. Note that this structure can be combined with any of the above structures of the EL layer.

Further, by forming EL layers to emit light of different colors from each other, a light-emitting element as a whole can provide light emission of a desired color. For example, in a light-emitting element having the two EL layers, the emission colors of the first and second EL layers are complementary, so that the light-emitting element can be made to emit white light as a whole. Note that "complementary colors" refer to colors that can produce an achromatic color when mixed. In other words, when lights obtained from substances which emit light of complementary colors are mixed, white emission can be obtained. This can be applied to a light-emitting element having three or more EL layers.

Figure 12C:
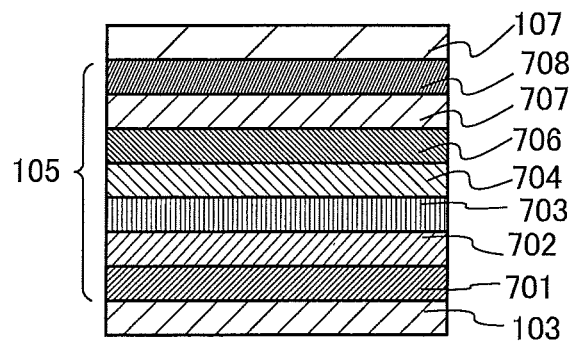

As illustrated in FIG. 12C, the EL layer 105 may include, between the first electrode 103 and the second electrode 107, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode 107.

The composite material layer 708 which is in contact with the second electrode 107 is preferably provided, in which case damage caused to the EL layer 105 particularly when the second electrode 107 is formed by a sputtering method can be reduced. The composite material layer 708 can be formed using the above composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (e.g., an oxide such as lithium oxide, a halide, or carbonate such as lithium carbonate or cesium carbonate), an alkaline earth metal compound (e.g., an oxide, a halide, or carbonate), or a rare earth metal compound (e.g., an oxide, a halide, or carbonate)).

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that a material similar to the material for the electron transport layer 704 described above can be used as the substance having a high electron-injection property.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other; thus, their functions hardly interfere with each other. Thus, an increase in the driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, any of CuPc, phthalocyanine tin(II) complex (SnPc), phthalocyanine zinc complex (ZnPc), cobalt (II) phthalocyanine, b-form (CoPc), phthalocyanine iron (FePc), and vanadyl 2,9,16,23-tetraphenoxy-29H,31H-phthalocyanine (PhO-VOPc) is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having a metal-oxygen double bond makes it possible to drive the light-emitting element at low voltage more stably.

As a metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that a phthalocyanine-based material having a phenoxy group is preferable as the phthalocyanine-based materials described above. Specifically, a phthalocyanine derivative having a phenoxy group, such as PhO-VOPc, is preferable. A phthalocyanine derivative having a phenoxy group is soluble in a solvent, and thus has an advantage of being easily handled during formation of a light-emitting element and an advantage of facilitating maintenance of an apparatus used for film formation.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron-relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C, 8H), N,N'-dihexyl-3,4,9,10-perylenetetracarboxylic diimide (Hex PTC), and the like.

As specific examples of the nitrogen-containing condensed aromatic compound, the following can be given: pirazino[2,3-f][1,10]phenanthroline-2,3-dicarbonitrile (PPDN), 2,3,6,7,10,11-hexacyano-1,4,5,8,9,12-hexaazatriphenylene (HAT(CN)$_6$), 2,3-diphenylpyrido[2,3-b]pyrazine (2PYPR), 2,3-bis(4-fluorophenyl)pyrido[2,3-b]pyrazine (F2PYPR), and the like.

Other than the above, 7,7,8,8-tetracyanoquinodimethane (abbreviation: TCNQ), 1,4,5,8-naphthalenetetracarboxylic-dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophene) (abbreviation: DCMT), methanofullerenes (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be formed using any of the materials given above.

As described above, the EL layer 105 of this embodiment can be formed.

Note that this embodiment can be combined with any of the other embodiments and example described in this specification as appropriate.

Embodiment 7

In this embodiment, examples of lighting devices including the light-emitting device according to one embodiment of the present invention will be described with reference to FIGS. 13A and 13B.

According to one embodiment of the present invention, a lighting device in which a light-emitting portion has a curved surface can be obtained.

The light-emitting device of one embodiment of the present invention can be used for lighting in a car; for example, lighting can be provided for a dashboard, a ceiling, or the like.

Figure 13A:
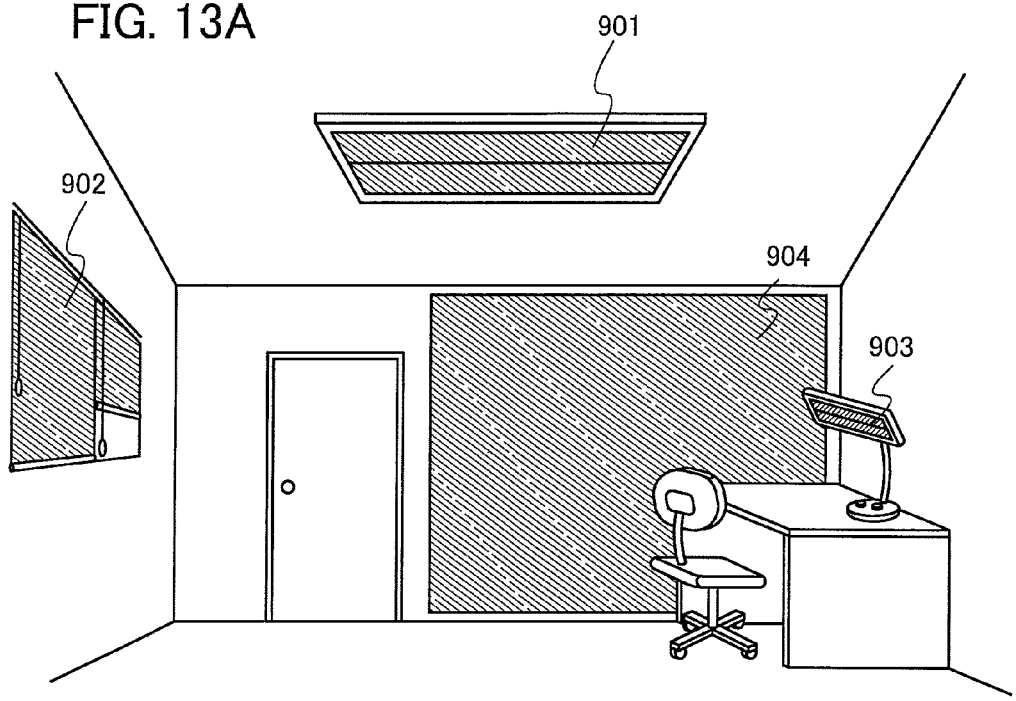
FIGS. 13A and 13B each illustrate a lighting device according to one embodiment of the present invention.

FIG. 13A illustrates an interior lighting device 901, a desk lamp 903, and a planar lighting device 904 to which the light-emitting device of one embodiment of the present invention is applied. Since the light-emitting device can have a larger area, it can be used as a lighting device having a large area. Further, since the light-emitting device is thin, it can be mounted on a wall. Furthermore, the light-emitting device can be used as a roll-type lighting device 902.

Figure 13B:
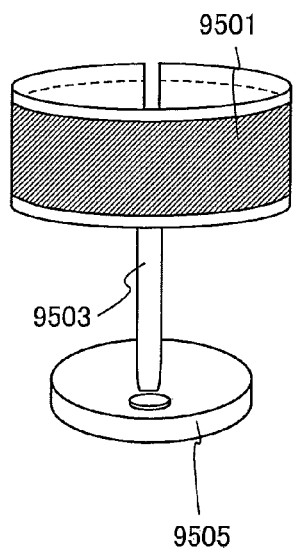

FIG. 13B illustrates another example of a lighting device. A desk lamp illustrated in FIG. 13B includes a lighting portion 9501, a support 9503, a support base 9505, and the like. The lighting portion 9501 includes the light-emitting device of one embodiment of the present invention. As described above, according to one embodiment of the present invention, a lighting device having a curved surface or a lighting device having a flexible lighting portion can be obtained. The use of a flexible light-emitting device for a lighting device as described above not only improves the degree of freedom in design of the lighting device but also enables the lighting device to be mounted onto a portion having a curved surface, such as a ceiling or a dashboard of a car.

Note that this embodiment can be combined with any of the other embodiments and example described in this specification as appropriate.

Example

In this example, separation layers each having an eaves portion were formed by the formation method described as an example in Embodiment 1, and cross sections of the separation layers were observed by SEM. Results of the SEM observation will be described.

First, a polyimide film having a negative photosensitivity was formed to a thickness of about 2 μm over a glass substrate by a spin coating method. Then, heat treatment was performed at 90° C. for 110 seconds. Then, light exposure was performed on a rectangular region having a short side with a thickness of 10 μm with the use of a light-exposure mask. Here, the light exposure was performed in such a manner that a stepper was used as a light-exposure machine, the light exposure time was 3500 milliseconds, and an i-line (wavelength: 365 nm) was used. After that, development treatment was performed to remove part of the polyimide film, which was not exposed to light, so that a leg portion was formed.

Next, a polyimide film having a negative photosensitivity similar to the above negative photosensitive polyimide film was formed over the substrate so that the thickness of part of the polyimide film, which was in contact with the substrate, was about 3 μm. After that, light exposure was performed twice: the first light exposure was performed after the light-exposure mask used for forming the leg portion was moved by 3 μm from the rectangular in the short side direction of the rectangular, and the second light exposure was performed after the light-exposure mask was moved by 3 μm from the rectangular in the short side direction of the rectangular in the direction opposite to the direction in the first light exposure. Here, three samples (Sample 1 to Sample 3) were manufactured by changing light exposure time as shown in Table 1.

TABLE 1

| Sample | Light exposure time |
| --- | --- |
| Sample 1 | 750 ms |
| Sample 2 | 1000 ms |
| Sample 3 | 1250 ms |

After the light exposure was performed on each of the samples, development treatment was performed in a manner similar to the develop treatment for the leg portion, so that Sample 1 to Sample 3 each provided with a separation layer with an eaves portion were obtained over the substrate.

Figure 14A:
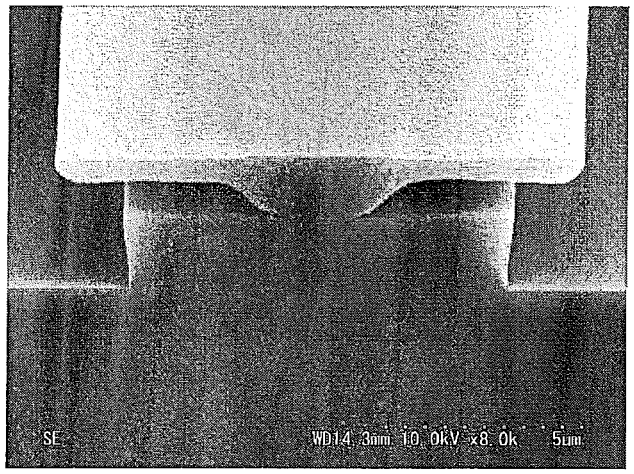
FIGS. 14A to 14C each show an observation result of a SEM image of a separation layer according to Example.
Figure 14B:
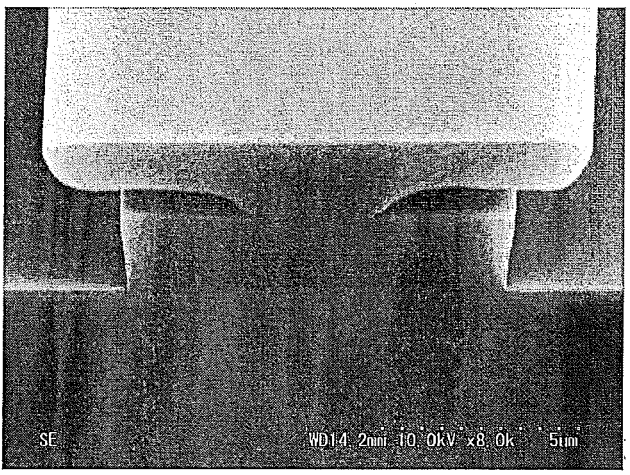
Figure 14C:
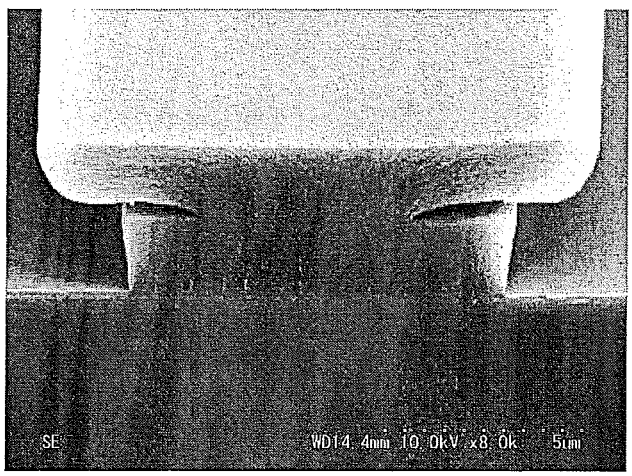

FIGS. 14A to 14C are cross-sectional scanning electron microscope (SEM) images of these samples, and results of observation of the cross-sectional SEM images are described. FIGS. 14A, 14B, and 14C are the cross-sectional SEM images of Sample 1, Sample 2, and Sample 3, respectively.

The SEM images show that in all of the samples, the separation layers are formed in each of which the leg portion with an inverted tapered shape and a stage portion whose side surface has an inverted tapered shape and which projects beyond the leg portion in the direction parallel to the substrate are stacked. Further, each of the SEM images show that there is a space between an upper surface of the leg portion and a surface of the stage portion, which faces the substrate and that the thickness of the central portion of the stage portion, which is in contact with the leg portion, is large.

Note that the lengths of the parts of the stage portions of the formed separation layers, which projected beyond the points where the side surfaces of the leg portions were in contact with the substrates in the direction parallel to the substrates in Sample 1, Sample 2, and Sample 3 were about 2.0 μm, about 2.2 μm, and about 2.4 μm, respectively.

Further, the comparison of the samples shows that the thickness of part of the stage portion, which was not in contact with the leg portion, decreased and the height of the space between the stage portion and the leg portion increased as the light exposure time decreased.

This application is based on Japanese Patent Application serial no. 2011-038870 filed with Japan Patent Office on Feb. 24, 2011, the entire contents of which are hereby incorporated by reference.

What is claimed is:

1. A method for forming an insulating pattern, comprising:
   forming a first organic film having a negative photosensitivity over a substrate;
   selectively exposing a first region of the first organic film to light through a light-exposure mask;
   removing part of the first organic film, which is not exposed to light, to form a first portion of an insulating pattern;
   forming a second organic film having a negative photosensitivity over the first portion;
   selectively exposing a second region of the second organic film to light through the light-exposure mask, wherein the second region partly overlaps with the first portion; and
   removing part of the second organic film, which is not exposed to light, to form a second portion of the insulating pattern over the first portion, wherein the second portion projects beyond the first portion in a direction parallel to the substrate.

2. The method according to claim 1,
   wherein part of a bottom surface of the second portion, which faces the substrate and is in contact with an upper edge of a side surface of the first portion, is depressed.

3. The method according to claim 1,
   wherein part of a bottom surface of the second portion, which faces the substrate, projects to be in contact with a top surface of the first portion, and
   wherein the bottom surface of the second portion and the top surface of the first portion face each other with a space therebetween.

4. A method for manufacturing a light-emitting device, comprising:
   forming a lower electrode layer;
   forming a first organic film having a negative photosensitivity over the lower electrode layer;
   selectively exposing a first region of the first organic film to light through a light-exposure mask;
   removing part of the first organic film, which is not exposed to light, to form a leg portion;
   forming a second organic film having a negative photosensitivity over the leg portion;
   selectively exposing a second region of the second organic film to light through the light-exposure mask, wherein the second region partly overlaps with the leg portion; and
   removing part of the second organic film, which is not exposed to light, to form a stage portion over the leg portion, wherein the stage portion projects beyond the leg portion in a direction parallel to the substrate;
   forming an EL layer over the stage portion and the lower electrode layer, wherein the EL layer formed over the stage portion is divided from the EL layer formed over the lower electrode layer; and
   forming an upper electrode layer covering the EL layer over the stage portion and the lower electrode layer, wherein the upper electrode layer formed over the stage portion is divided from the upper electrode layer formed over the lower electrode layer.

5. The method according to claim 4,
   wherein part of a bottom surface of the stage portion, which faces the substrate and is in contact with an upper edge of a side surface of the leg portion, is depressed.

6. The method according to claim 4,
   wherein part of a bottom surface of the stage portion, which faces the substrate, projects to be in contact with a top surface of the leg portion, and wherein the bottom surface of the stage portion and the top surface of the leg portion face each other with a space therebetween.

\* \* \* \* \*